United States Patent
Sole Rojals et al.

(10) Patent No.: US 9,621,921 B2
(45) Date of Patent: Apr. 11, 2017

(54) COEFFICIENT GROUPS AND COEFFICIENT CODING FOR COEFFICIENT SCANS

(71) Applicant: QUALCOMM Incorporated, San Diego, CA (US)

(72) Inventors: Joel Sole Rojals, La Jolla, CA (US); Rajan Laxman Joshi, San Diego, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 532 days.

(21) Appl. No.: 13/834,006

(22) Filed: Mar. 15, 2013

(65) Prior Publication Data

US 2013/0272379 A1    Oct. 17, 2013

Related U.S. Application Data

(60) Provisional application No. 61/625,039, filed on Apr. 16, 2012, provisional application No. 61/667,382, filed on Jul. 2, 2012.

(51) Int. Cl.
*H04N 19/129* (2014.01)
*H04N 19/60* (2014.01)
(Continued)

(52) U.S. Cl.
CPC ............. *H04N 19/60* (2014.11); *H03M 7/40* (2013.01); *H04N 19/102* (2014.11);
(Continued)

(58) Field of Classification Search
CPC ...... H04N 19/70; H04N 19/176; H04N 19/30; H04N 19/187; H04N 19/44; H04N 19/597;
(Continued)

(56) References Cited

U.S. PATENT DOCUMENTS 6,195,389 B1    2/2001   Rodriguez et al.
8,552,890 B2 *  10/2013  Kim et al. ............... 341/51
(Continued)

FOREIGN PATENT DOCUMENTS

WO    2007027414 A2    3/2007
WO    2011128268 A1    10/2011
(Continued)

OTHER PUBLICATIONS

International Preliminary Report on Patentability from International Application No. PCT/US2013/036646, The International Bureau of WIPO—Geneva, Switzerland, Jun. 25, 2014, 9 pp.
(Continued)

*Primary Examiner* — Dave Czekaj
*Assistant Examiner* — Kehinde O Abimbola
(74) *Attorney, Agent, or Firm* — Shumaker & Sieffert, P.A.

(57) ABSTRACT

Techniques are described for a video coder (e.g., video encoder or video decoder) that is configured to select a context pattern from a plurality of context patterns that are the same for a plurality of scan types. Techniques are also described for a video coder that is configured to select a context pattern that is stored as a one-dimensional context pattern and identifies contexts for two or more scan types.

41 Claims, 16 Drawing Sheets

(51) Int. Cl.
*H04N 19/176* (2014.01)
*H04N 19/13* (2014.01)
*H04N 19/102* (2014.01)
*H04N 19/18* (2014.01)
*H04N 19/167* (2014.01)
*H03M 7/40* (2006.01)

(52) U.S. Cl.
CPC ........... *H04N 19/129* (2014.11); *H04N 19/13* (2014.11); *H04N 19/167* (2014.11); *H04N 19/176* (2014.11); *H04N 19/18* (2014.11); *H03M 7/4018* (2013.01)

(58) Field of Classification Search
CPC .. H04N 19/184; H04N 19/46; G06K 9/00342; G06K 2009/00738; G06K 9/00711; G06K 9/00355; G06K 9/00993; G06K 9/00234; G06K 19/04; G06K 19/06028; G06K 19/06187; G06K 19/077
See application file for complete search history.

(56) References Cited

U.S. PATENT DOCUMENTS

| | | | |
|---|---|---|---|
| 8,581,753 B2* | 11/2013 | Kim et al. ................ | 341/51 |
| 8,867,614 B2* | 10/2014 | Shiodera et al. ......... | 375/240.03 |
| 2005/0084012 A1 | 4/2005 | Hsu et al. | |
| 2008/0123736 A1 | 5/2008 | Sekiguchi et al. | |
| 2008/0123947 A1 | 5/2008 | Moriya et al. | |
| 2008/0123972 A1 | 5/2008 | Sekiguchi et al. | |
| 2008/0219578 A1* | 9/2008 | Lee ............................ | 382/247 |
| 2009/0123066 A1* | 5/2009 | Moriya et al. ............. | 382/166 |
| 2009/0224950 A1* | 9/2009 | Xu ............................. | 341/51 |
| 2009/0251342 A1 | 10/2009 | Bacri | |
| 2009/0279613 A1 | 11/2009 | Suzumura | |
| 2010/0195715 A1 | 8/2010 | Liu et al. | |
| 2011/0090967 A1* | 4/2011 | Chen et al. ............... | 375/240.16 |
| 2011/0142419 A1 | 6/2011 | Zou et al. | |
| 2012/0044987 A1 | 2/2012 | Bennett | |
| 2012/0082233 A1* | 4/2012 | Sze et al. .................. | 375/240.18 |
| 2012/0082235 A1 | 4/2012 | Lou et al. | |
| 2012/0121012 A1* | 5/2012 | Shiodera et al. ......... | 375/240.03 |
| 2012/0140814 A1 | 6/2012 | Sole Rojals et al. | |
| 2012/0207222 A1 | 8/2012 | Lou et al. | |
| 2012/0207400 A1 | 8/2012 | Sasai et al. | |
| 2012/0229478 A1 | 9/2012 | Sze et al. | |
| 2013/0003857 A1 | 1/2013 | Yu et al. | |
| 2013/0051459 A1* | 2/2013 | Kirchhoffer ............. | H04N 19/50 375/240.07 |
| 2013/0051475 A1 | 2/2013 | Joshi et al. | |
| 2013/0177066 A1 | 7/2013 | Ye et al. | |
| 2013/0187796 A1* | 7/2013 | Kim et al. ................ | 341/51 |
| 2013/0187797 A1* | 7/2013 | Kim et al. ................ | 341/51 |
| 2013/0188684 A1* | 7/2013 | Terada ..................... | H04N 19/70 375/240.02 |
| 2013/0188688 A1* | 7/2013 | Panusopone ............ | H04N 19/13 375/240.02 |
| 2013/0188736 A1* | 7/2013 | Kim et al. ................ | 375/240.25 |
| 2013/0235925 A1 | 9/2013 | Nguyen et al. | |
| 2013/0272378 A1 | 10/2013 | Sole Rojals | |
| 2013/0272423 A1 | 10/2013 | Chien | |
| 2013/0272427 A1 | 10/2013 | Sasai et al. | |
| 2014/0140400 A1 | 5/2014 | George et al. | |
| 2014/0269928 A1 | 9/2014 | Piao et al. | |
| 2015/0010072 A1 | 1/2015 | Hsu et al. | |

FOREIGN PATENT DOCUMENTS

| | | |
|---|---|---|
| WO | 2011128303 A2 | 10/2011 |
| WO | 2011142817 A1 | 11/2011 |
| WO | 2011128303 A3 | 2/2012 |
| WO | 2012088325 A1 | 6/2012 |

OTHER PUBLICATIONS

Itu-T H.265, Series H: Audiovisual and Multimedia Systems, Infrastructure of audiovisual services—Coding of moving video, Advanced video coding for generic audiovisual services, The International Telecommunication Union. Apr. 2013, 317 pp.
Bross et al., "High efficiency video coding (HEVC) text specification draft 10 (For FDIS & Last Call)," 12th Meeting: Geneva, CH, Jan. 14-23, 2013, JCTVC-L1003_v34, 310 pp.
Bross et al., "High efficiency video coding (HEVC) text specification draft 10 (For FDIS & Consent)," 12th Meeting: Geneva, CH, Jan. 14-23, 2013, JCTV-L1003_v29, 330 pp.
Bross et al., "High efficiency video coding (HEVC) text specification draft 6," 8th Meeting: San Jose, CA, USA, Feb. 1-10, 2012, JCTVC-H1003, 259 pp.
Bross et al., "High efficiency video coding (HEVC) text specification draft 7," 9th Meeting: Geneva, CH, Apr. 27-May 7, 2012, JCTVC-I1003_d2, 290 pp.
Bross et al., "High efficiency video coding (HEVC) text specification draft 7," 9th Meeting: Geneva, CH, Apr. 27-May 7, 2012, JCTV-I1003_d4, 297 pp.
Bross et al., "High efficiency video coding (HEVC) text specification draft 8," 10th Meeting: Stockholm, SE, Jul. 11-20, 2012, JCTVC-J1003_d7, 261 pp.
Bross et al., "High efficiency video coding (HEVC) text specification draft 9," 11th Meeting: Shanghai, CN, Oct. 10-19, 2012, JCTVC-K1003_v7, 290 pp.
Bross et al., "WD4: Working Draft 4 of High-Efficiency Video Coding," 6th Meeting: JCTVC-F803_d2, Torino, IT, Jul. 14-22, 2011, 226 pp.
Bross et al., "WD5: Working Draft 5 of High-Efficiency Video Coding," 7th Meeting: Geneva, Switzerland, Nov. 21-30, 2011, JCTVC-G1103_d2, 214 pp.
International Search Report and Written Opinion—PCT/US2013/036646—ISA/EPO—Jul. 8, 2013, 12 pp.
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Kumakura et al., "Non-CE3: Simplified context derivation for significance map", JCT-VC Meeting; MPEG Meeting; Geneva; (Joint Collaborative Team on Video Coding of ISO/IEC JTC1/SC29/WG11 and ITU-T SG.16); 9th Meeting: Geneva, CH, Apr. 27-May 7, 2012, JCTVC-I0296, 8 pp. XP030112059.
Marpe et al., "Context-based adaptive binary arithmetic coding in the H.264/AVC video compression standard", IEEE Transactions on Circuits and Systems for Video Technology, vol. 13, No. 7, Jul. 2003, 17 pp.
Panusopone et al., "Adaptive Scan for Large Blocks for HEVC," Joint Collaborative Team on Video Coding (JCT-VC) of ITU-T SG16 WP3 and ISO/IEC JTC1/SC29/WG11, 6th Meeting: Torino, IT, Jul. 14-22, 2011, JCTVC-F569_r2, 6 pp.
Rosewarne et al., "Non-CE11: Harmonisation of 8×8 TU Residual Scan," Joint Collaborative Team on Video Coding (JCT-VC) of ITU-T SG16 WP3 and ISO/IEC JTC1/SC29/WG11, 8th Meeting: San Jose, California, Feb. 1-10, 2012, JCTVC-H0145, 11 pp.
Sole et al., "Removal of the 8×2 and 2×8 Coefficient Groups," Joint Collaborative Team on Video Coding (JCT-VC) of ITU-T SG16 WP3 and ISO/IEC JTC1/SC29/WG11, 10th Meeting: Stockholm, SE, Jul. 11-20, 2012, JCTVC-J0256, 11 pp.
U.S. Appl. No. 61/509,926, by Yunfei Zheng, filed Jul. 20, 2011.
U.S. Appl. No. 61/554,292, by Yunfei Zheng, filed Nov. 1, 2011.
Wiegand et al., "WD2: Working Draft 2 of High-Efficiency Video Coding," JCTVC-D503, 4th Meeting: Daegu, KR, Jan. 20-28, 2011, 153 pp.
Wiegand et al., "WD3: Working Draft 3 of High-Efficiency Video Coding," Document JCTVC-E603, 5th Meeting: Geneva, CH, Mar. 16-23, 2011, 193 pp.
Wiegand et al., "WD1: Working Draft 1 of High-Efficiency Video Coding", JCTVC-C403, 3rd Meeting: Guangzhou, CN, Oct. 7-15, 2010, 137 pp.
Zhu et al., "Binarization and context model selection of CABAC based on the distribution of syntax element", IEEE, 2012 Picture Coding Symposium (PCS), May 7-9, 2012, 4 pp.

(56) References Cited

OTHER PUBLICATIONS

Second Written Opinion of international application No. PCT/US2013/036646, mailed Mar. 24, 2014, 6 pp.

Auyeung, et al., "Context Reduction of 8×8 Significance Map Coding by Hybrid Scan With Mask," Joint Collaborative Team on Video Coding (JCT-VC) of ITU-T SG16WP3 and ISO/IEC JTC1/SC29/WG11 8th Meeting: San Jose, CA, USA, Feb. 1-10, 2012, JCTVC-H0379, 9 pp.

Joshi, et al., "Modification of Context Assignment for Significance Flag Coding for Large TUs," Joint Collaborative Team on Video Coding (JCT-VC) of ITU-T SG 16 WP 3 and ISO/IEC JTC 1/SC 29/WG 11 10th Meeting: Stockholm, SE, Jul. 11-20, 2012 JCTVC-J0354, 5 pp.

Tsukuba, et al., "Refined Significance Map Context Derivation for Large TU," Joint Collaborative Team on Video Coding (JCT-VC) of ITU-TSG 16 WP 3 and ISO/IEC JTC 1/SC 29/WG 11 10th Meeting: Stockholm, SE, Jun. 29, 2012, JCTVC-J0068 (version1), 4 pp.

Sze V., et al., "CE3: Summary Report of Core Experiment on Coefficient Scanning and coding," JCTVC-I0023, ITU T/ISO/IEC JCT-VC meeting, Geneva, Switzerland, Apr. 27-May 7, 2012 (9 pages).

\* cited by examiner

HORIZONTAL

VERTICAL

| $CGF_B = 0$, $CBF_R = 0$ | | | |
|---|---|---|---|
| 1 | 1 | 1 | 0 |
| 1 | 1 | 0 | 0 |
| 1 | 0 | 0 | 0 |
| 0 | 0 | 0 | 0 |

FIG. 5A

| $CGF_B = 0$, $CBF_R = 1$ | | | |
|---|---|---|---|
| 1 | 1 | 1 | 1 |
| 1 | 1 | 1 | 1 |
| 0 | 0 | 0 | 0 |
| 0 | 0 | 0 | 0 |

FIG. 5B

| $CGF_B = 1$, $CBF_R = 0$ | | | |
|---|---|---|---|
| 1 | 1 | 0 | 0 |
| 1 | 1 | 0 | 0 |
| 1 | 1 | 0 | 0 |
| 1 | 1 | 0 | 0 |

FIG. 5C

| $CGF_B = 1$, $CBF_R = 1$ | | | |
|---|---|---|---|
| 2 | 2 | 2 | 2 |
| 2 | 2 | 2 | 2 |
| 2 | 2 | 2 | 1 |
| 2 | 2 | 1 | 1 |

FIG. 5D

| $CGF_B = 0, CBF_R = 0$ | | | |
|---|---|---|---|
| 2 | 1 | 1 | 0 |
| 1 | 1 | 1 | 0 |
| 1 | 1 | 1 | 0 |
| 0 | 0 | 0 | 0 |

FIG. 9A

| $CGF_B = 0, CBF_R = 1$ | | | |
|---|---|---|---|
| 2 | 2 | 2 | 2 |
| 1 | 1 | 1 | 1 |
| 0 | 0 | 0 | 0 |
| 0 | 0 | 0 | 0 |

FIG. 9B

| $CGF_B = 1, CBF_R = 0$ | | | |
|---|---|---|---|
| 2 | 1 | 0 | 0 |
| 2 | 1 | 0 | 0 |
| 2 | 1 | 0 | 0 |
| 2 | 1 | 0 | 0 |

FIG. 9C

| $CGF_B = 1, CBF_R = 1$ | | | |
|---|---|---|---|
| 2 | 2 | 2 | 2 |
| 2 | 2 | 2 | 2 |
| 2 | 2 | 2 | 2 |
| 2 | 2 | 2 | 2 |

FIG. 9D

| $CGF_B = X, CBF_R = X$ | | | |
|---|---|---|---|
| 1 | 0 | 0 | 0 |
| 0 | 0 | 0 | 0 |
| 0 | 0 | 0 | 0 |
| 0 | 0 | 0 | 0 |

FIG. 10

COEFFICIENT GROUPS AND COEFFICIENT CODING FOR COEFFICIENT SCANS

RELATED APPLICATIONS

This application claims the benefit of:

U.S. Provisional Application No. 61/625,039, filed Apr. 16, 2012, and

U.S. Provisional Application No. 61/667,382, filed Jul. 2, 2012, the entire content each of which is incorporated by reference herein.

TECHNICAL FIELD

This disclosure relates to video coding and more particularly to techniques for coding syntax elements in video coding.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques defined according to video coding standards. Digital video devices may transmit, receive, encode, decode, and/or store digital video information more efficiently by implementing such video compression techniques. Video coding standards include ITU-T H.261, ISO/IEC MPEG-1 Visual, ITU-T H.262 or ISO/IEC MPEG-2 Visual, ITU-T H.263, ISO/IEC MPEG-4 Visual and ITU-T H.264 (also known as ISO/IEC MPEG-4 AVC), including its Scalable Video Coding (SVC) and Multiview Video Coding (MVC) extensions. In addition, High-Efficiency Video Coding (HEVC) is a video coding standard being developed by the Joint Collaboration Team on Video Coding (JCT-VC) of ITU-T Video Coding Experts Group (VCEG) and ISO/IEC Motion Picture Experts Group (MPEG).

Video compression techniques perform spatial (intra-picture) prediction and/or temporal (inter-picture) prediction to reduce or remove redundancy inherent in video sequences. For block-based video coding, a video slice (i.e., a video frame or a portion of a video frame) may be partitioned into video blocks, which may also be referred to as treeblocks, coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to a reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in order to produce a one-dimensional vector of transform coefficients, and entropy coding may be applied to achieve even more compression.

SUMMARY

In general, this disclosure describes techniques for encoding and decoding data representing significance of transform coefficients, such as significant coefficient flags and coefficient group flags, in transform coefficient coding. Various techniques for determining a context to be used for CABAC (Context Adaptive Binary Arithmetic Coding) coding syntax elements associated with transform coefficients are described.

For example, in some techniques, a video encoder and a video decoder select a context pattern from a same plurality of context patterns for a scan type of a horizontal scan, a vertical scan, and a diagonal scan. In other words, regardless of whether a sub-block is scanned vertically, horizontally, or diagonally, the video encoder and video decoder may select the context pattern from the same context patterns for all three scan types. The video encoder and the video decoder utilize the contexts within the selected the context pattern to CABAC encode or CABAC decode, respectively, significance syntax elements of a transform block.

As another example, in some techniques, a video encoder and a video decoder may select a context pattern that is stored as a one-dimensional context pattern. In some examples, the video encoder and video decoder utilize the selected context pattern for two or more scan types of the sub-block. For example, if the sub-block is scanned horizontally, the video encoder and video decoder utilize the selected context pattern, and if the sub-block is scanned vertically, the video encoder and the video decoder utilize the selected context pattern.

In one example, the disclosure describes a method for decoding video data. The method comprising receiving, in a bitstream, significance syntax elements for transform coefficients of a current sub-block of a block, selecting a context pattern from a plurality of two-dimensional context patterns for a plurality of scan types for the significance syntax elements of the transform coefficients of the current sub-block, wherein the plurality of two-dimensional context patterns is the same for each of the plurality of scan types, and wherein each of the context patterns is associated with a condition of whether one or more neighboring sub-blocks include any non-zero transform coefficients, assigning contexts to each of the significance syntax elements of the transform coefficients based on the selected context pattern, and context adaptive binary arithmetic coding (CABAC) decoding the significance syntax elements of the transform coefficients of the current sub-block based on the assigned contexts.

In another example, the disclosure describes a device for decoding video data, the device comprising a video decoder configured to receive, in a bitstream, significance syntax elements for transform coefficients of a current sub-block of a block, select a context pattern from a plurality of two-dimensional context patterns for a plurality of scan types for the significance syntax elements of the transform coefficients of the current sub-block, wherein the plurality of two-dimensional context patterns is the same for each of the plurality of scan types, and wherein each of the context patterns is associated with a condition of whether one or more neighboring sub-blocks include any non-zero transform coefficients, assign contexts to each of the significance syntax elements of the transform coefficients based on the selected context pattern, and context adaptive binary arithmetic coding (CABAC) decode the significance syntax elements of the transform coefficients of the current sub-block based on the assigned contexts.

In another example, the disclosure describes a computer-readable storage medium having instructions stored thereon that when executed cause one or more processors of a device for decoding video data to receive, in a bitstream, significance syntax elements for transform coefficients of a current sub-block of a block, select a context pattern from a plurality of two-dimensional context patterns for a plurality of scan types for the significance syntax elements of the transform coefficients of the current sub-block, wherein the plurality of two-dimensional context patterns is the same for each of the plurality of scan types, and wherein each of the context patterns is associated with a condition of whether one or more neighboring sub-blocks include any non-zero transform coefficients, assign contexts to each of the significance syntax elements of the transform coefficients based on the selected context pattern, and context adaptive binary arithmetic coding (CABAC) decode the significance syntax elements of the transform coefficients of the current sub-block based on the assigned contexts.

In another example, the disclosure describes a method for encoding video data. The method comprising generating significance syntax elements for transform coefficients of a current sub-block of a block, selecting a context pattern from a plurality of two-dimensional context patterns for a plurality of scan types for the significance syntax elements of the transform coefficients of the current sub-block, wherein the plurality of two-dimensional context patterns is the same for each of the plurality of scan types, and wherein each of the context patterns is associated with a condition of whether one or more neighboring sub-blocks include any non-zero transform coefficients, assigning contexts to each of the significance syntax elements of the transform coefficients based on the selected context pattern, context adaptive binary arithmetic coding (CABAC) encoding the significance syntax elements of the transform coefficients of the current sub-block based on the assigned contexts, and outputting the encoded significance syntax elements.

In another example, the disclosure describes a device for encoding video data, the device comprising a video encoder configured to generate significance syntax elements for transform coefficients of a current sub-block of a block, select a context pattern from a plurality of two-dimensional context patterns for a plurality of scan types for the significance syntax elements of the transform coefficients of the current sub-block, wherein the plurality of two-dimensional context patterns is the same for each of the plurality of scan types, and wherein each of the context patterns is associated with a condition of whether one or more sub-blocks include any non-zero transform coefficients, assign contexts to each of the significance syntax elements of the transform coefficients based on the selected context pattern, context adaptive binary arithmetic coding (CABAC) encode the significance syntax elements of the transform coefficients of the current sub-block based on the assigned contexts, and output the encoded significance syntax elements.

In another example, the disclosure describes a device for encoding video data, the device comprising means for generating significance syntax elements for transform coefficients of a current sub-block of a block, means for selecting a context pattern from a plurality of two-dimensional context patterns for a plurality of scan types for the significance syntax elements of the transform coefficients of the current sub-block, wherein the plurality of two-dimensional context patterns is the same for each of the plurality of scan types, and wherein each of the context patterns is associated with a condition of whether one or more neighboring sub-block include any non-zero transform coefficients, means for assigning contexts to each of the significance syntax elements of the transform coefficients based on the selected context pattern, means for context adaptive binary arithmetic coding (CABAC) encoding the significance syntax elements of the transform coefficients of the current sub-block based on the assigned contexts, and means for outputting the encoded significance syntax elements.

In another example, the disclosure describes a method for decoding video data. The method comprising receiving, in a bitstream, significance syntax elements of transform coefficients for a current sub-block of a block, selecting a context pattern that is stored as a one-dimensional context pattern, wherein the context pattern identifies contexts for two or more scan types of the current sub-block, assigning contexts to the significance syntax elements of the transform coefficients for the current sub-block based on the selected context pattern, and context adaptive binary arithmetic coding (CABAC) decoding the significance syntax elements of the transform coefficients of the current sub-block based on the assigned contexts.

In another example, the disclosure describes a device for decoding video data, the device comprising a video decoder configured to receive, in a bitstream, significance syntax elements of transform coefficients for a current sub-block of a block, select a context pattern that is stored as a one-dimensional context pattern, wherein the context pattern identifies contexts for two or more scan types of the current sub-block, assign contexts to the significance syntax elements of the transform coefficients for the current sub-block based on the selected context pattern, and context adaptive binary arithmetic coding (CABAC) decode the significance syntax elements of the transform coefficients of the current sub-block based on the assigned contexts.

In another example, the disclosure describes a computer-readable storage medium having instructions stored thereon that when executed cause one or more processors of a device for decoding video data to receive, in a bitstream, significance syntax elements of transform coefficients for a current sub-block of a block, select a context pattern that is stored as a one-dimensional context pattern, wherein the context pattern identifies contexts for two or more scan types of the current sub-block, assign contexts to the significance syntax elements of the transform coefficients for the current sub-block based on the selected context pattern, and context adaptive binary arithmetic coding (CABAC) decode the significance syntax elements of the transform coefficients of the current sub-block based on the assigned contexts.

In another example, the disclosure describes a method for encoding video data. The method comprising generating significance syntax elements of transform coefficients for a current sub-block of a block, selecting a context pattern that is stored as a one-dimensional context pattern, wherein the context pattern identifies contexts for two or more scan types of the current sub-block, assigning contexts to the significance syntax elements of the transform coefficients for the current sub-block based on the selected context pattern, context adaptive binary arithmetic coding (CABAC) encoding the significance syntax elements of the transform coefficients of the current sub-block based on the assigned contexts, and outputting the encoded significance syntax elements.

In another example, the disclosure describes a device for encoding video data, the device comprising a video encoder configured to generate significance syntax elements of transform coefficients for a current sub-block of a block, select a context pattern that is stored as a one-dimensional context pattern, wherein the context pattern identifies contexts for two or more scan types of the current sub-block, assign contexts to the significance syntax elements of the transform coefficients for the current sub-block based on the selected context pattern, context adaptive binary arithmetic coding (CABAC) encode the significance syntax elements of the transform coefficients of the current sub-block based on the assigned contexts, and output the encoded significance syntax elements.

In another example, the disclosure describes a device for encoding video data, the device comprising means for generating significance syntax elements of transform coefficients for a current sub-block of a block, means for selecting a context pattern that is stored as a one-dimensional context pattern, wherein the context pattern identifies contexts for two or more scan types of the current sub-block, means for assigning contexts to the significance syntax elements of the transform coefficients for the current sub-block based on the selected context pattern, means for context adaptive binary arithmetic coding (CABAC) encoding the significance syntax elements of the transform coefficients of the current sub-block based on the assigned contexts, and means for outputting the encoded significance syntax elements.

The details of one or more examples are set forth in the accompanying drawings and the description below. Other features, objects, and advantages will be apparent from the description and drawings, and from the claims.

BRIEF DESCRIPTION OF DRAWINGS

FIGS. 5A-5D are conceptual diagrams that illustrate an example of patterns for context assignment for coefficients in a sub-block.

FIGS. 9A-9D are conceptual diagrams that illustrate examples of patterns for context assignment for coefficients in a sub-block.

FIG. 10 is a conceptual diagram that illustrates an example of a pattern for context assignment for coefficients in a sub-block.

DETAILED DESCRIPTION

Figure 1:
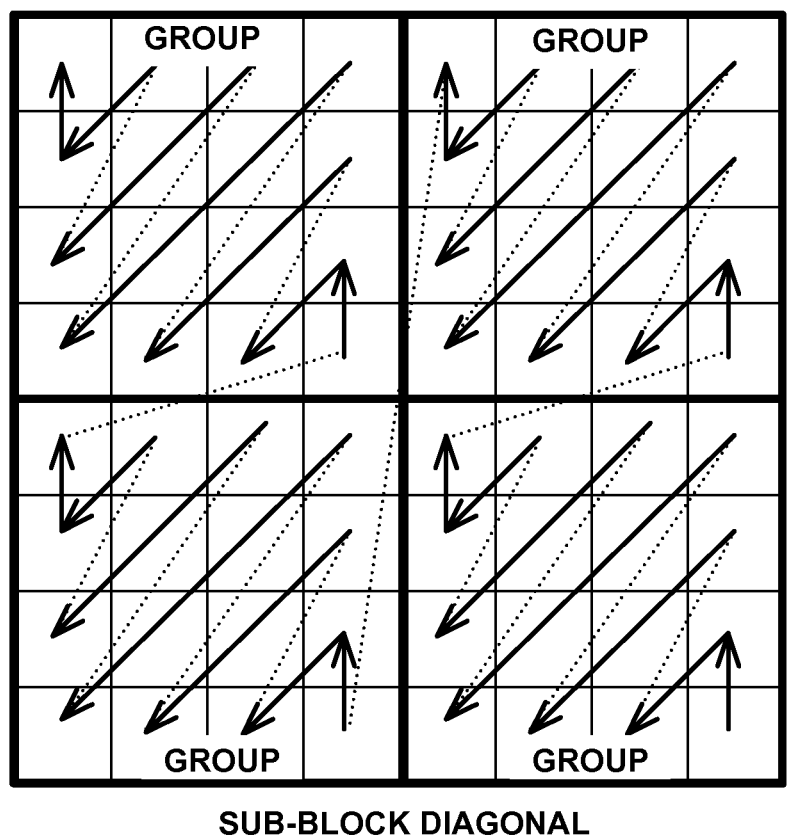
FIG. 1 is a conceptual diagram that illustrates an example of coefficient groups and scans for a video block.

A video coder designed according to some examples, such as that proposed in the working draft 7 (WD7) of the High Efficiency Video Coding (HEVC) standard, referred to as HEVC WD7 herein and available from http://phenix.it-sudparis.eu/jct/doc_end_user/documents/9_Geneva/wg11/JCTVC-I1003-v5.zip, may require a different data access for non-square coefficient groups than a 4×4 sub-block coefficient group. This may impose additional hardware and software complexity during implementation of the video coder. The additional hardware and software complexity may be reduced if the non-square coefficient groups are removed and 4×4 sub-block coefficients are scanned according to one of a diagonal, vertical, or horizontal scan type. However, this modification may reduce coding efficiency when the context derivations defined according to HEVC WD7 are used for assigning contexts to syntax elements that indicate whether a sub-block includes significant coefficients. Thus, this disclosure describes technique for assigning contexts for syntax elements that indicate whether a sub-block includes significant coefficients which may provide for improved coding efficiency.

For instance, in some of these other techniques (i.e., those not necessarily in accordance with the techniques described in this disclosure), context patterns are used for a subset of the possible sizes for transform units (TUs or transform blocks) for coding of syntax elements that indicate the significance of transform coefficients of the transform units (referred to as significance syntax elements). Also, these other techniques used the context patterns for limited scan types. Accordingly, computational resources are wasted by having to determine the size of the TU so that a determination can be made about whether context patterns can be used.

In the techniques described in this disclosure, the same context patterns are used for a plurality of scan types (e.g., a horizontal scan, a vertical scan, and a diagonal scan) for a variety of different sized TUs. For instance, a video encoder or a video decoder may select a context pattern from the same plurality of context patterns for a 4×4 sub-block of an 8×8 TU regardless of the scan type for the 4×4 sub-block (e.g., regardless of whether the 4×4 sub-block is horizontally scanned, vertically scanned, or diagonally scanned). As described in more detail, each of the plurality of context patterns is associated with a condition of whether one or more neighboring sub-blocks include any significant transform coefficients (e.g., any non-zero transform coefficients). As also described in more detail, this disclosure describes characteristics of the plurality of context patterns from which the video encoder or video decoder selects the context pattern. In this way, computational efficiencies may be realized since the video encoder and the video decoder can use the same context patterns for determining contexts for significance syntax elements for a plurality of scan types (e.g., a horizontal scan, vertical scan, and diagonal scan) for the significance syntax elements of the sub-block, including a 4×4 sub-block of an 8×8 block (i.e., 8×8 TU).

In the above examples, the context patterns may be two-dimensional context patterns. However, aspects of this disclosure are not so limited. In some examples, the video encoder and the video decoder select a context pattern that is stored as a one-dimensional context pattern. For example, some context patterns may be defined as two-dimensional context patterns. It may be possible to pre-compute a one-dimensional context pattern from the two-dimensional context pattern. Pre-computing may speed up the encoding and decoding process. For example, the transform coefficients may be converted from a two-dimensional block into a one-dimensional block. With the pre-computed one-dimensional patterns, encoding and decoding efficiencies may be realized if a one-dimensional pattern is used for encoding or decoding the significance syntax elements because the transform coefficients are converted to a one-dimensional block, as compared to using the two-dimensional context pattern on a one-dimensional block. It should be understood that pre-computing the one-dimensional context pattern from the two-dimensional context pattern is not required in every example, and should not be considered as a limited way of determining the one-dimensional context pattern.

There may be various ways in which the one-dimensional context pattern may be computed. As one example, a two-dimensional context pattern is diagonally scanned, horizontally scanned, and vertically scanned to produce three one-dimensional context patterns (e.g., one for each scan type). In the techniques described in this disclosure, the two-dimensional context patterns may comprise characteristics that reduce the total number of one-dimensional context patterns that are produced.

For example, if there are four two dimensional context patterns that are each scanned horizontally, vertically, and diagonally to produce one-dimensional context patterns, then there would a total of 12 one-dimensional context patterns. In some examples, the four two dimensional context patterns may include contexts that are arranged in such a way that two different scans result in the same one dimensional context pattern.

For instance, one of the two-dimensional context patterns may include contexts that if scanned horizontally or vertically result in the same one-dimensional context pattern. As another example, one of the two-dimensional context patterns may include contexts that when scanned horizontally results in a one-dimensional context pattern that is the same one-dimensional vector that would result if another of the two-dimensional context patterns were scanned vertically. As another example, one of the two-dimensional context patterns may include contexts that when scanned horizontally, vertically, and diagonally result in the same one-dimensional context pattern.

In this way, there may be overlap in the resulting one-dimensional context patterns that result from the different scanning of the context patterns, which reduces the total number of one-dimensional context patterns that need to be stored. This allows one context pattern to be used for two or more scan types of the sub-block.

For instance, as described above, one of the two-dimensional context patterns includes contexts that when scanned horizontally, vertically, and diagonally result in the same one-dimensional context pattern. Accordingly, for this context pattern only one one-dimensional context pattern is stored because the one-dimensional context pattern is the same for all three types of context pattern scans.

As another example, one of the two-dimensional context patterns includes contexts that when scanned horizontally or vertically result in the same one-dimensional context pattern. In this case, the one-dimensional context pattern for the diagonal scan is stored, and the one-dimensional context pattern for either the horizontal scan or the vertical scan is stored, but not both, because the one-dimensional context pattern that results from the horizontal and vertical scan is the same. In these examples, these one-dimensional context patterns computed from the two-dimensional context patterns may be pre-computed and stored, which may speed up the encoding and decoding processes.

Moreover, in some examples, the one-dimensional context pattern need not necessarily be computed from a two-dimensional context pattern. Rather, the one-dimensional context pattern may be preselected and stored, as a one-dimensional context pattern. Even in these examples, the one-dimensional context pattern may identify contexts for two or more scan types of the current sub-block.

Digital video devices implement video compression techniques to encode and decode digital video information more efficiently. Video compression techniques may be defined according to a video coding standard, such as the HEVC standard currently under development by the JCT-VC. The HEVC standardization efforts are based on a model of a video coding device referred to as the HEVC Test Model (HM). The HM presumes improvements in the capabilities of video coding devices with respect to video coding devices available during the development of previous video coding standards, e.g., ITU-T H.264/AVC. For example, whereas H.264 provides nine intra-prediction encoding modes, HEVC provides as many as thirty-five intra-prediction encoding modes. Further, as part of the HEVC standardization efforts, the JCT-VC has defined test conditions that may be used to evaluate how individual modifications to drafts of the HEVC standard may impact overall coding performance. One criteria used to evaluate coding performance is the so-called BD-rate.

A recent working Draft (WD) of HEVC, referred to as "HEVC Working Draft 7" or "WD7," is described in document JCTVC-I1003_d4, Bross et al., "High efficiency video coding (HEVC) text specification draft 7," Joint Collaborative Team on Video Coding (JCT-VC) of ITU-T SG16 WP3 and ISO/IEC JTC1/SC29/WG11, 9th Meeting: Geneva, Switzerland, April.-May, 2012. Further, another recent working draft of HEVC, Working Draft 9 (WD9), is described in document JCTVC-K1003 v7, Bross et al., "High Efficiency Video Coding (HEVC) Text Specification Draft 9," Joint Collaborative Team on Video Coding (JCT-VC) of ITU-T SG16 WP3 and ISO/IEC JTC1/SC29/WG11, 11th Meeting: Shanghai, CN, October, 2012. The latest version of WD9 is found from http://phenix.int-evry.fr/jct/doc_end_user/documents/12_Geneva/wg11/JCTVC-L1003-v29.zip.

Although techniques of this disclosure are described with respect to the ITU-T H.264 standard and the upcoming HEVC standard, the techniques of this disclosure are generally applicable to any video coding standard. Coding according to some of the presently proposed aspects of the developing HEVC standard will be described in this application for purposes of illustration. However, the techniques described in this disclosure may also be useful for and applied to other video coding processes, such as those defined according to ITU-T H.264 or other standard or proprietary video coding processes.

A video sequence typically includes a series of video frames, also referred to as pictures. A group of pictures (GOP) generally comprises a series of one or more of the video frames. A GOP may include syntax data in a header of the GOP, a header of one or more of the pictures, or elsewhere, that describes a number of pictures included in the GOP. Each frame may include a plurality of slices. Each slice of a picture may include slice syntax data that describes a coding mode for the respective slice. Each slice may include a plurality of video blocks or coding units. The video blocks may have fixed or varying sizes, and may differ in size according to a specified coding standard.

Video blocks may be encoded by applying spatial (intra-frame) prediction and/or temporal (inter-frame) prediction techniques to reduce or remove redundancy inherent in video sequences. A spatial prediction may be referred to as an "intra mode" (I-mode), and a temporal prediction may be referred to as an "inter mode" (P-mode or B-mode). Prediction techniques generate a predictive block of video data, which may also be referred to as a block of reference samples. A block of original video data to be coded is compared to the predictive block. The difference between the original block of video data and the predictive block may be referred to as residual data. Residual data is typically an array of the difference between pixel values of a predictive block and the original block of video data.

A transform, e.g., a discrete cosine transform (DCT) or conceptually similar transform, an integer transform, a wavelet transform, or another type of transform, may be applied to the residual data during the coding process to generate a corresponding set of transform coefficients. Thus, the original block of video can be reconstructed by performing an inverse transform on the transform coefficients and adding the residual data to the predictive block. Transform coefficients may also be quantized. Quantization generally refers to a process in which transform coefficients are quantized to possibly reduce the amount of data used to represent the coefficients, providing further compression. That is, the values of the transform coefficients may be represented as a bit string according to a defined bit-depth. For example, an n-bit value may be rounded down to an m-bit value during quantization, where m is less than n. In some cases, quantization may result in the representation of low value transform coefficients as zero. Quantized transform coefficients may be referred to as transform coefficient levels.

Following quantization, the quantized transform coefficients may be entropy encoded according to an entropy coding methodology, such as, for example, content adaptive variable length coding (CAVLC), context adaptive binary arithmetic coding (CABAC), or probability interval partitioning entropy coding (PIPE). Syntax elements, such as a syntax element defining a prediction mode, may also be entropy coded. To perform CAVLC, a video encoder may select a variable length code for a symbol to be transmitted. Codewords in VLC may be constructed such that relatively shorter codes correspond to more probable symbols, while longer codes correspond to less probable symbols. To perform CABAC, a video encoder may assign a context within a context model to a symbol to be transmitted.

For some entropy encoding techniques a predefined scan order may be used to scan the quantized transform coefficients to produce a serialized vector of quantized transform coefficients that can be entropy encoded. Thus, according to predictive video coding residual values comprising pixel difference values may be transformed into transform coefficients, quantized, and scanned to produce serialized transform coefficients for entropy coding.

For video coding, as one example, a video frame may be partitioned into one or more slices, where a slice includes consecutive integer number of coding units. A coding unit (CU) generally refers to a rectangular image region that serves as a basic unit to which various coding tools are applied for video compression. In general, the techniques of this disclosure relate to transforming, quantizing, scanning, and entropy coding data of a CU. A CU is typically square, and may be considered to be similar to a so-called "macroblock" described in other video coding standards such as, for example, ITU-T H.264. A CU may be considered an array of video sample values. Video sample values may also be referred to as picture elements, pixels, or pels. A CU usually has a luminance component, denoted as Y, and two chroma components, denoted as U and V. The two chroma components may also be respectively denoted as $C_b$ and $C_r$ components. The size of a CU may be defined according to a number of horizontal and vertical samples. Thus, a CU may be described as an N×N or N×M CU. In this disclosure, "N×N" and "N by N" may be used interchangeably to refer to the pixel dimensions of a video block in terms of vertical and horizontal dimensions, e.g., 16×16 pixels or 16 by 16 pixels. In general, a 16×16 block will have 16 pixels in a vertical direction (y=16) and 16 pixels in a horizontal direction (x=16). Likewise, an N×N block generally has N pixels in a vertical direction and N pixels in a horizontal direction, where N represents a nonnegative integer value. The pixels in a block may be arranged in rows and columns. Moreover, blocks need not necessarily have the same number of pixels in the horizontal direction as in the vertical direction. For example, blocks may comprise N×M pixels, where M is not necessarily equal to N.

To achieve better coding efficiency, a CU may have variable sizes depending on video content. According to HEVC, syntax data within a bitstream may define a largest coding unit (LCU), which is a largest CU for a frame or picture in terms of the number of samples. Typically, an LCU includes 64×64 luma samples, but the size of an LCU may vary depending on coding application. LCUs may also be referred to as "coding tree units." CUs of other dimensions may be generated by recursively partitioning an LCU into sub-CUs. The partitioning of LCUs into sub-CUs may be performed using a quadtree structure known as "residual quad tree" (RQT). Thus, LCUs may also be referred to as treeblocks. According to quadtree partitioning, a root node of the quadtree, such as an LCU, may be split into four smaller nodes, and each child node may in turn be further split into another four smaller nodes. Syntax data for a bitstream may define a maximum number of times an LCU may be split, referred to as CU depth. Accordingly, a bitstream may also define a smallest coding unit (SCU). Typically, an SCU includes 8×8 luma samples. Thus, in one example, four 32×32 CUs may be generated by partitioning a 64×64 LCU into four sub-CUs and each of the 32×32 CUs may be further partitioned into sixteen 8×8 CUs.

A CU may include one or more associated prediction units (PUs) and/or transform units (TUs). In general, a PU includes data that is used to generate a predictive block of video data for a CU. PUs may also be referred to as "prediction partitions." Syntax data associated with a CU may describe the partitioning of a CU into one or more PUs. A PU can be square or non-square in shape. The type data included in a PU may differ depending on whether a CU is skip or direct mode encoded, intra-prediction mode encoded, or inter-prediction mode encoded. For example, when the CU is to be intra-mode encoded, a PU may include data describing an intra-prediction mode and when the CU is to be inter-mode encoded, a PU may include data defining a motion vector for the PU. The data defining the motion vector for a PU may describe, for example, a horizontal component of the motion vector, a vertical component of the motion vector, a resolution for the motion vector (e.g., one-quarter pixel precision or one-eighth pixel precision), a reference picture to which the motion vector points, and/or a reference picture list for the motion vector. Following the prediction using the PUs of a CU, a video coder may calculate residual data a CU.

The HM supports prediction in various PU sizes. Assuming that the size of a particular CU is 2N×2N, the HM supports intra-prediction in PU sizes of 2N×2N or N×N, and inter-prediction in symmetric PU sizes of 2N×2N, 2N×N, N×2N, or N×N. The HM also supports asymmetric partitioning for inter-prediction in PU sizes of 2N×nU, 2N×nD, nL×2N, and nR×2N. In asymmetric partitioning, one direction of a CU is not partitioned, while the other direction is partitioned into 25% and 75%. The portion of the CU corresponding to the 25% partition is indicated by an "n" followed by an indication of "Up", "Down," "Left," or "Right." Thus, for example, "2N×nU" refers to a 2N×2N CU that is partitioned horizontally with a 2N×0.5N PU on top and a 2N×1.5N PU on bottom.

As described above, a transform may be applied to residual data to transform the residual data from a pixel domain to a transform domain. The HEVC standard allows for transformations according to TUs, which may be different for different CUs. The TUs are typically sized based on the size of PUs within a given CU, although this may not always be the case. The size of a TU may be the same as the size of a CU or a CU may be partitioned into a plurality of TUs. TUs are typically the same size or smaller than the PUs. In HEVC, syntax data associated with a CU may describe partitioning of the CU into one or more TUs according to a quadtree.

In general, a TU is used for in the process of transforming residual data into transform coefficients. A TU can be square or non-square in shape. For example, a block of 8×8 residual values may be transformed into a set of 8×8 transform coefficients. This set of transform coefficients may be more generally referred to as a transform block. For example, one transform may be performed on the residual values associated with the 16×16 array of samples or a transform may be performed on each of four 8×8 arrays of samples. Larger TUs generally provide more compression with more perceivable "blockiness" in a reconstructed image, whereas smaller TUs generally provide less compression with less perceivable "blockiness." The selection of TU sizes may be based on a rate-distortion optimization analysis. Available TU sizes may include 32×32, 16×16, and 8×8 TUs. It should be noted that this disclosure typically uses the term "video block" to refer to a coding node of a CU. In some specific cases, this disclosure may also use the term "video block" to refer to a treeblock, i.e., LCU, or a CU, which includes a coding node and PUs and TUs.

Conceptually, a transform block or TU may be a two-dimensional (2D) matrix of transform coefficients. As described above, a video coder may perform a quantization operation on a transform block. A predefined scan order may be used to scan the quantized transform coefficients to produce a serialized vector of quantized transform coefficients. The serialized vector of quantized transform coefficient may then be entropy encoded to provide further compression.

In some examples, for 16×16 and 32×32 TUs, a 4×4 sub-block scan is used to produce a serialized vector of quantized transform coefficients. For example, the sub-blocks are scanned in the reverse direction using a top-right to bottom-left scan. Within a sub-block the transform coefficients are also scanned in the reverse direction a using a bottom-right to top-left scan. This type of scan may be referred to as diagonal 4×4 sub-block scan. In some examples, 8×8 TUs may also use the diagonal 4×4 sub-block scan as one possible scan. FIG. 1 is a conceptual diagram that illustrates an example of coefficient groups and scans for a video block. FIG. 1 illustrates an 8×8 video block divided into four 4×4 sub-blocks where a diagonal scan is performed on each of the sub-blocks. A sub-block may also be referred to as a coefficient group. In FIG. 1, each coefficient group is identified and separated using thicker interior lines. As illustrated in FIG. 1, there are four coefficient groups and each coefficient group includes 16 coefficients. The scans within the sub-blocks in FIG. 1 are shown using the directional arrows.

Figure 2A:
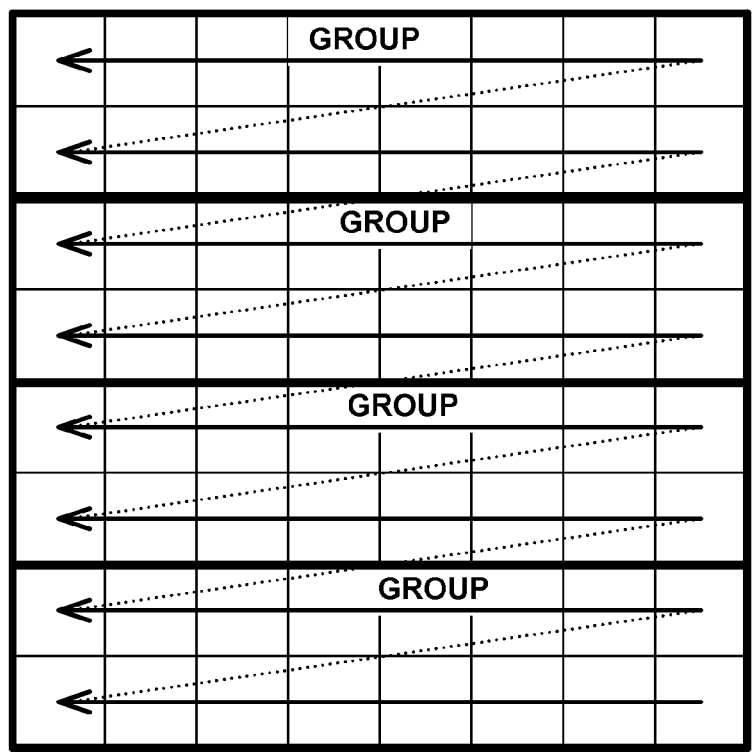
FIGS. 2A-2B are conceptual diagrams that illustrate examples of coefficient groups and scans for a video block.
Figure 2B:
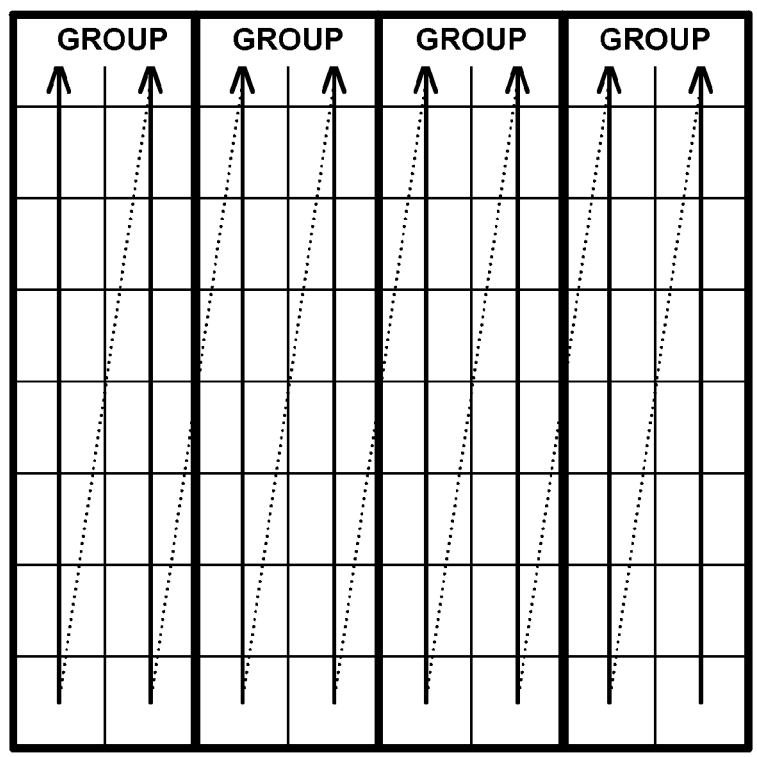

In addition to the diagonal 4×4 sub-block scan, mode dependent coefficient scans allow for non-square horizontal and vertical scans for some 8×8 intra prediction modes. For non-square horizontal and vertical scans of an 8×8 TU, the coefficient groups are defined as 8×2 rectangles for the non-square horizontal scan (i.e., 16 consecutive coefficients in the scan order). In a similar manner, coefficient groups are defined as 2×8 rectangles for the non-square vertical scan. FIGS. 2A-2B illustrate non-square coefficient groups with horizontal and vertical scans of an 8×8 TU, respectively. In FIGS. 2A-2B, each coefficient group is identified and separated using thicker interior lines. As illustrated in FIGS. 2A-2B, there are four coefficient groups and each coefficient group includes 16 coefficients. In FIG. 2A, the sub-blocks are scanned using a right-to-left scan. As illustrated in FIG. 2B, the sub-blocks are scanned using a bottom-to-top scan. The scans within the sub-blocks in FIGS. 2A-2B are shown using the directional arrows. It should be noted that a video coder designed according to HEVC WD7 may require a different data access for the non-square coefficient groups than the regular 4×4 sub-block coefficient groups. This may impose additional hardware and software complexity during implementation of the video coder.

Figure 3A:
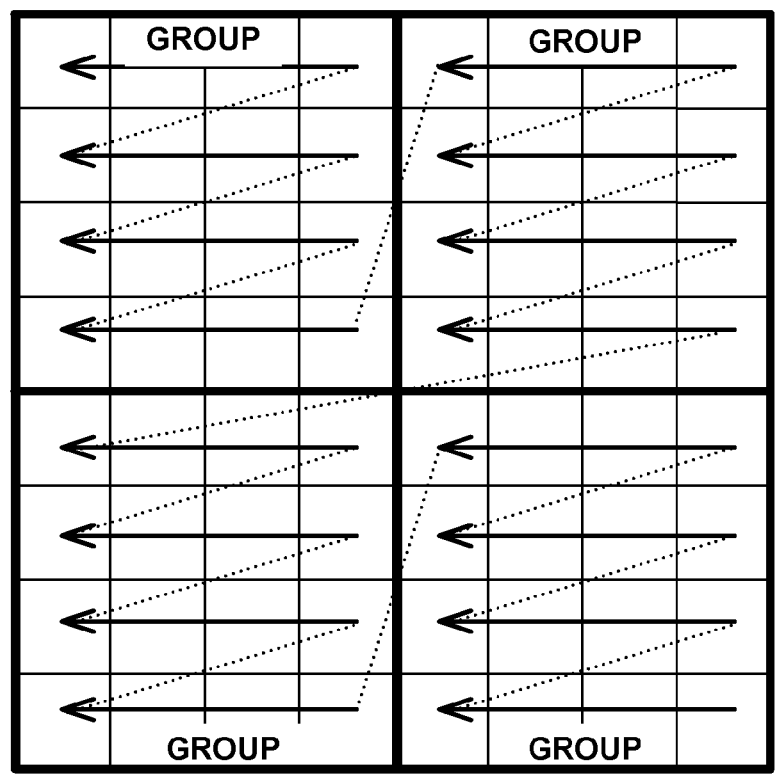
FIGS. 3A-3B are conceptual diagrams that illustrate examples of coefficient groups and scans for a video block.
Figure 3B:
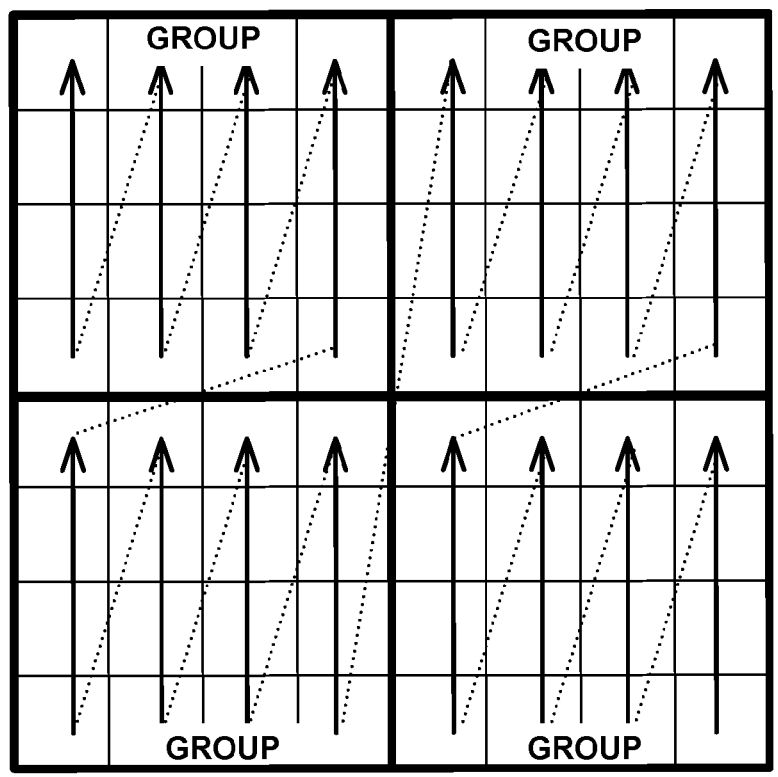

Thus, in addition to the diagonal 4×4 sub-block scan and the non-square horizontal and vertical scans, horizontal and vertical sub-block scans have been also been proposed for 4×4 sub-blocks of an 8×8 TU as an alternative to the non-square horizontal and vertical scans. Examples of sub-block horizontal and vertical scans are described in: (1) Rosewarne, C., Maeda, M. "Non-CE11: Harmonisation of 8×8 TU residual scan" JCT-VC Contribution JCTVC-H0145; (2) Yu, Y., Panusopone, K., Lou, J., Wang, L. "Adaptive Scan for Large Blocks for HEVC; JCT-VC Contribution JCTVC-F569; and (3) U.S. patent application Ser. No. 13/551,458, filed Jul. 17, 2012, each of which is hereby incorporated by reference. Two example horizontal and vertical 4×4 sub-blocks scans which may be used for an 8×8 TU are illustrated in FIGS. 3A-3B. In FIGS. 3A-3B, each coefficient group is identified and separated using thicker interior lines. Similar to the groups illustrated in FIG. 1, in FIGS. 3A-3B, there are four 4×4 coefficient groups which are scanned in the reverse direction using a top-right to bottom-left scan. The scans within the sub-blocks are illustrated using directional arrows.

It should be noted that while using the horizontal 4×4 sub-block scan and the vertical 4×4 sub-block scan as alternatives to the non-square horizontal and vertical scans, according to proposal JCTVC-H0145, using the set of the diagonal 4×4 sub-block, the horizontal 4×4 sub-block scan, and the vertical 4×4 sub-block scan as possible scans of an 8×8 TU resulted in a performance BD-rate loss of 0.3% for the intra configuration when compared to using a set of the diagonal 4×4 sub-block, the horizontal 8×2 rectangular scan, and the vertical 2×8 rectangular scan as possible scans for 8×8 TU. That is, substituting the scans illustrated in FIGS. 2A-2B with the scans illustrated in FIGS. 3A-3B decreased coding performance by 0.3% in some test cases.

In examples of video coding, each sub-block is coded using five coding passes, namely, (1) a significance pass, (2) a greater than one pass, (3) a greater than two pass, (4) a sign pass, and (5) a coefficient level remaining pass. Significance coding refers to generating syntax elements to indicate whether any of the coefficients within a sub-block have a value of one or greater. That is, a coefficient with a value of one or greater is considered significant. The coding of significance includes two parts. For the first part of significance coding, a syntax element is coded or inferred for each coefficient group (i.e., a 4×4 sub-block) that indicates whether there are any non-zero coefficients in the sub-block. One example of such a syntax element is referred to as a coefficient group flag (CGF). In HEVC WD7, the CGF may be represented by syntax element significant_coeff_group_flag. In HEVC WD9, the syntax element name of the coefficient group flag has been changed from significant_coeff_group_flag to coded_sub_block_flag (which may also be referred to as CSBF since the coefficient groups are 4×4 sub-blocks). This disclosure refers to a coefficient group flag as a CGF, which may correspond to either of the significant_coeff_group_flag or coded_sub_block_flag syntax elements.

For the second part of significant coding, if CGF is 1 (i.e., there are non-zero coefficients in the sub-block), then syntax elements are generated for each transform coefficient in the coefficient group indicating whether the transform coefficient is significant or not (i.e., a value of one or greater). Examples of such syntax elements are referred to as significance syntax elements, examples of which are significant coefficient flags. In HEVC WD7 and WD9, significant coefficient flags are represented by the syntax element significant_coefficient_flag.

In other words, for coding of significance of coefficients, two types of syntax elements are coded. A first syntax element (e.g., CGF) is coded for each coding group (i.e., a sub-block) that indicates whether there any non-zero coefficients in the coding group. If the first syntax element indicates that there is at least one non-zero coefficient in the coding group, then a second syntax element (e.g., significance syntax element or significant_coefficient_flag) is coded for each coefficient in the coding group that indicates whether a coefficient is zero or a non-zero coefficient.

A greater than one pass generates syntax elements to indicate whether the absolute value of a significant coefficient is larger than one. In one example, a syntax element referred to as coeff_abs_level_greater1_flag (abbreviated "gr1Flag") provides an indication as to whether a significant coefficient has an absolute value greater than one. In a similar manner, the greater than two pass generates syntax elements to indicate whether the absolute value of a greater than one coefficient is larger than two. In one example, a syntax element referred to as coeff_abs_level_greater2_flag (abbreviated "gr2Flag") provides an indication as to whether a greater than one coefficient has an absolute value greater than two.

A sign pass generates syntax elements to indicate the sign information for significant coefficients. In one example, a syntax element referred to as coeff_sign_flag (abbreviated "signFlag") may indicate the sign information for a significant coefficient. For example, a value of 0 for the signFlag may indicate a positive sign, while a value of 1 may indicate a negative sign. A coefficient level remaining pass generates syntax elements that indicate the remaining absolute value of a transform coefficient level (e.g., the remainder value). In one example, a syntax element referred to as coeff_abs_level_remain (abbreviated "levelRem") may provide this indication. The levelRem syntax element may not be signaled unless the gr2Flag is present for any given coefficient, as one example, although such a limitation is not always required. In one example, a coefficient with a value of level may be coded as (abs(/eve/)-x), where the value of x depends on the presence of gr1Flag and gr2Flag. For example, x may be equal to 3 if a gr2Flag is present. In some examples, the value of level may be coded as (abs(level)-3) for any coefficient for which there is a remainder. It should be noted that the five pass approach is just one example technique that may be used for coding transform coefficient and the techniques described herein may be equally applicable to other techniques.

Further, in addition to the syntax elements described above, a position of a last significant coefficient within a TU may be signaled in the bitstream. The position of the last significant coefficient in the TU depends on a scan order associated with the TU. The scan order for purposes of identifying a last significant coefficient may be any of the scan orders described above or another predetermined scan order. In HEVC WD7, the position of the last significant coefficient within a block is indicated by specifying an x-coordinate value and a y-coordinate value. The x-coordinate value may be indicated using the last_significant_coeff_x_prefix and last_significant_coeff_x_suffix syntax elements. The y-coordinate value may be indicated using the last_significant_coeff_y_prefix and last_significant_coeff_y_suffix syntax elements.

Figure 4:
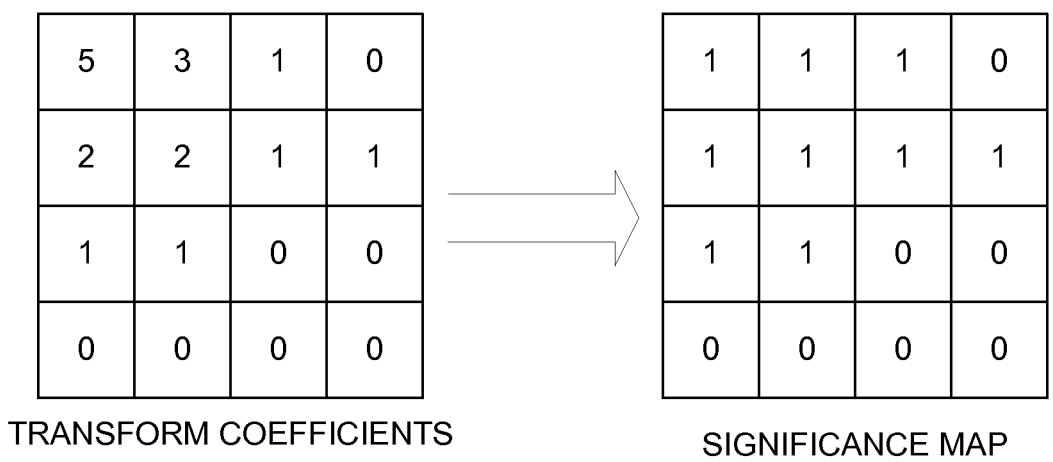
FIG. 4 is a conceptual diagram that illustrates a relation between transform coefficients in a video block and a significance map associated with the video block.

In this manner, the syntax elements described above can be used to signal a so-called significance map of transform coefficients where a significance map illustrated the position of significant coefficients with a TU. FIG. 4 is a conceptual diagram that illustrates a relation between transform coefficients in a transform block and a significance map associated with the transform map. As illustrated in FIG. 4, the significance map includes a "1" to indicate each instance of a significant coefficient value, i.e., a value greater than zero, in the transform block. Also, in this example, the value of the CFG is "1" to indicate that there is at least one non-zero coefficient in the coding group (i.e., the sub-block).

For example, the sub-block on the left, in FIG. 4, illustrates example transform coefficients (e.g., quantized transform coefficients). As illustrated, there is at least one non-zero coefficient in the sub-block, hence the CFG is 1. Also, the significance map on the right, in FIG. 4, includes the significance syntax element (e.g., the significant coefficient flag) for each transform coefficient in the sub-block. For example, the significant coefficient flag value 1 for all corresponding transform coefficients indicates that the value of these transform coefficients is not zero (i.e., a non-zero transform coefficient), and value 0 for all corresponding transform coefficients indicates that the value of these transform coefficients is zero.

In HEVC, syntax elements related to quantized transform coefficients, such as the significant_coeff_group_flag and significant_coefficient_flag described above and other syntax elements may be entropy coded using CABAC (Context Adaptive Binary Arithmetic Coding). To apply CABAC coding to a syntax element, binarization may be applied to a syntax element to form a series of one or more bits, which are referred to as "bins." In addition, a coding context may be associated with a bin of the syntax element. The coding context may identify probabilities of coding bins having particular values. For instance, a coding context may indicate a 0.7 probability of coding a 0-valued bin (representing an example of a "most probable symbol," in this instance) and a 0.3 probability of coding a 1-valued bin. After identifying the coding context, a bin may be arithmetically coded based on the context. In some cases, contexts associated with a particular syntax element or bins thereof may be dependent on other syntax elements or coding parameters.

For example, the CGF context derivation depends on the scan order of the corresponding coefficient group. For example, for a coefficient group scanned according to the diagonal 4×4 sub-block scan (e.g., in the cases of 16×16 and 32×32 TUs and some 8×8 TUs), the CGF context (i.e., the context of syntax element significant_coeff_group_flag) depends on the CGF of the sub-block to the right of ($CGF_R$) and below ($CGF_B$) the coefficient group. For the non-square horizontal and vertical scans illustrated in FIG. 2A-2B (e.g., in that case of an 8×8 TU), the CGF context of the coefficient group depends only on the CGF of the previously coded coefficient group. For the horizontal scan, the previous coded coefficient group refers to the coded coefficient group below the coefficient group. For the vertical scan, the previous coefficient group refers to the coefficient group to the right of the coefficient group.

It should be noted that in HEVC WD7, because the context derivation of a CGF is different for the diagonal 4×4 sub-block scan (i.e., depends on $CGF_R$ and $CGF_B$) and the non-square horizontal and vertical scans (i.e., depends only on previous CGF), a different logic path is required for the CGF context derivation for the 4×4 diagonal sub-block coefficient group and the CGF context derivation for the non-square horizontal and vertical scans, which may also impose hardware and software complexity.

In HEVC WD7, the contexts assigned to the significant_coefficient_flag syntax element are dependent on (1) the position of the transform coefficient within the 4×4 sub-block, (2) the CGFs of the sub-block to the right ($CGF_R$) and below ($CGF_B$) the current sub-block, and (3) whether the sub-block contains the DC coefficient. Kumakura, T., Fukushima, S. "Non-CE3: Simplified context derivation for significant map" JCT-VC Contribution JCTVC-I0296, which is hereby incorporated by reference in its entirety, provides one example where coefficients within a 4×4 sub-block are assigned contexts depending on the values of $CGF_R$ and $CGF_B$ and the position of a coefficient within a sub-block.

FIGS. 5A-5D illustrate four different patterns for context assignments of significant coefficient flags of a 4×4 sub-block depending on $CGF_R$ and $CGF_B$. It should be noted that in FIGS. 5A-5D, although the context numbering starts with 0, this is for illustration purposes and does not reflect the actual context numbers used in HEVC WD7, but only relative context numbering. As illustrated in FIGS. 5A-5D, each context pattern includes 16 context values, where each context value corresponds to the coefficient located in the respective position. Further, as illustrated in FIGS. 5A-5D, a context pattern is determined based on values of $CGF_R$ and $CGF_B$. In this manner, the patterns in FIGS. 5A-5D illustrate an example where contexts are assigned to significant coefficient flags based on the position of the transform coefficient within the 4×4 sub-block and the values of $CGF_R$ and $CGF_B$. It should be noted that context assignments illustrated in FIGS. 5A-5D are not optimal for horizontal or vertical sub-block scans illustrated in FIGS. 3A-3B based on the probable location of significant coefficients within a vector generated using the scans.

Further, in one example, the values of contexts within a context pattern may be modified based on whether the corresponding sub-block includes the DC coefficient. The DC coefficient may be the first coefficient of the transform and may generally indicate the average amount energy in the entire block, as one example. For luma transform coefficients, if a 4×4 sub-block does not contain a DC coefficient, a context offset may be applied. In some examples, a context offset of 3 is applied. As an example, if a 4×4 sub-block does not contain DC coefficient, and a context assignment derived from a context pattern is 2, the actual context used may be 5. In other words, the context derivation process may be exactly the same in both cases (i.e., a pattern is selected from a set of patterns based on the values of $CGF_R$ and $CGF_B$), but different sets of contexts are used for DC and non-DC sub-blocks. That is, DC and non-DC blocks do not share the same contexts.

This disclosure uses the term "DC sub-block" to refer to a sub-block of a block (e.g., a TU) that includes a DC coefficient of the block. For example, assuming the DC coefficient of a TU is an upper-left-most coefficient, an upper-left-most sub-block of the TU including the DC coefficient may be referred to as a DC sub-block. Further, in one example, for chroma transform coefficients, the context offset determination based on whether the 4×4 sub-block contains the DC coefficient is not applied. That is, the contexts are shared for DC sub-blocks and non-DC sub-blocks for chroma transform coefficients. Thus, in some cases only three contexts are used for transform coefficients associates with the chroma components. Further, in some cases, a DC coefficient may always use a separate context, which is shared for all TU sizes. Further, in HEVC WD7, significance map context derivation for an 8×8 TU uses a scaled 8×8 table for the context assignment and, as such, the significance map coding for an 8×8 TU is not unified with the significance map context derivation for 16×16 and 32×32 TUs.

This disclosure describes several techniques for coding the syntax elements associated with transform coefficients included in a transform block, such as the coding group flag syntax element (i.e., significant_coeff_group_flag or coded_sub_block_flag) and the significant coefficient syntax elements (i.e., significant_coefficient_flag). In particular, this disclosure describes techniques where the scanning orders in FIGS. 3A-3B may be used as an alternative to non-square coefficient groups illustrated in FIGS. 2A-2B. Further, this disclosure describes context derivation techniques for the syntax elements associated with transform coefficients wherein the techniques are based on the characteristics of the sub-block scans illustrated in FIGS. 3A-3B. In one example, the context derivation techniques may mitigate the BD-rate performance loss, as described above, when the scans illustrated in FIGS. 3A-3B are used instead of the scans illustrated in FIGS. 2A-2B.

Figure 6:
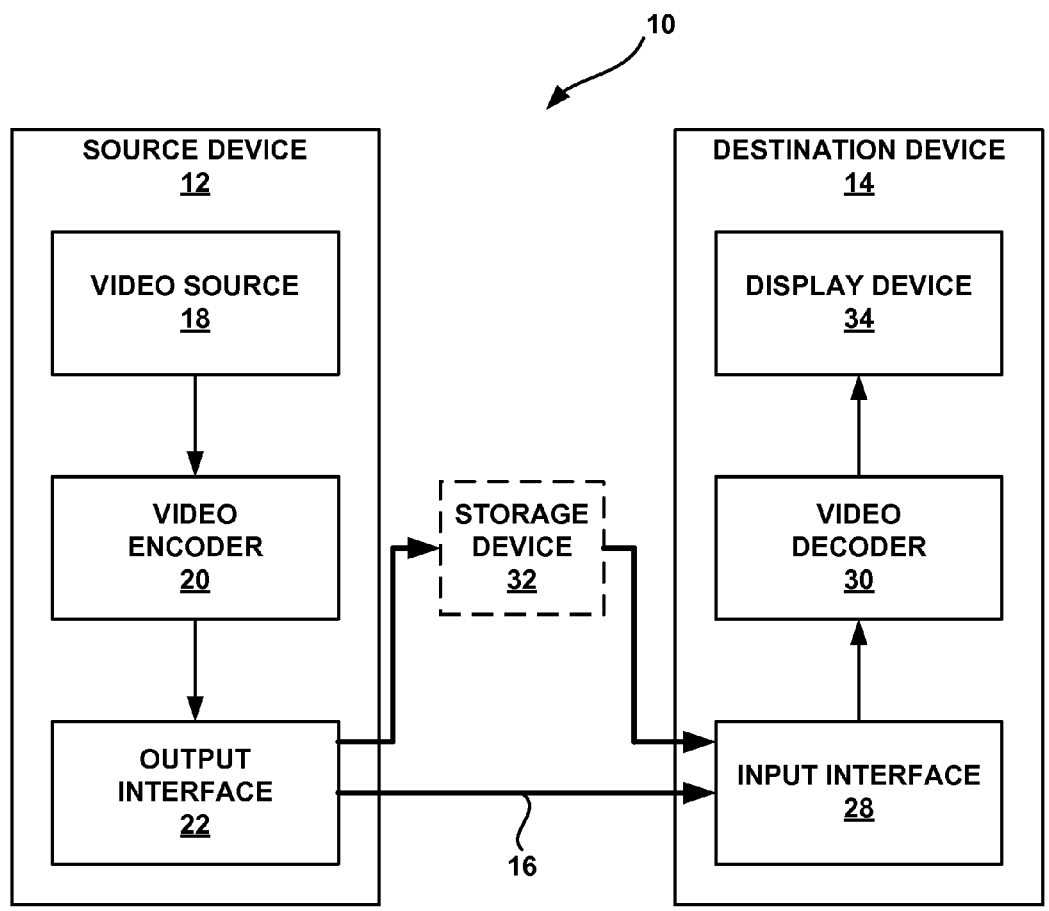
FIG. 6 is a block diagram illustrating an example video encoding and decoding system that may utilize the inter-prediction techniques described in this disclosure.

FIG. 6 is a block diagram illustrating an example video encoding and decoding system 10 that may be configured to assign contexts utilizing the techniques described in this disclosure. As shown in FIG. 6, system 10 includes a source device 12 that generates encoded video data to be decoded at a later time by a destination device 14. Source device 12 and destination device 14 may comprise any of a wide range of devices, including desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or the like. In some cases, source device 12 and destination device 14 may be equipped for wireless communication. However, the techniques of this disclosure are not necessarily limited to wireless applications or environments. The techniques may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, system 10 may be configured to support one-way or two-way video transmission to support applications such as video streaming, video playback, video broadcasting, and/or video telephony.

In the example of FIG. 6, source device 12 includes a video source 18, video encoder 20, and an output interface 22. In some cases, output interface 22 may include a modulator/demodulator (modem) and/or a transmitter. In source device 12, video source 18 may include a source such as a video capture device, e.g., a video camera, a video archive containing previously captured video, a video feed interface to receive video from a video content provider, and/or a computer graphics system for generating computer graphics data as the source video, or a combination of such sources. As one example, if video source 18 is a video camera, source device 12 and destination device 14 may form so-called camera phones or video phones. However, the techniques described in this disclosure may be applicable to video coding in general, and may be applied to wireless and/or wired applications. The captured, pre-captured, or computer-generated video may be encoded by video encoder 12. The encoded video data may be transmitted directly to destination device 14 via output interface 22 of source device 20 via link 16. The encoded video data may also (or alternatively) be stored onto storage device 32 for later access by destination device 14 or other devices, for decoding and/or playback.

Link 16 may comprise any type of medium or device capable of transporting the encoded video data from source device 12 to destination device 14. In one example, link 16 may comprise a communication medium to enable source device 12 to transmit encoded video data directly to destination device 14 in real-time. The encoded video data may be modulated according to a communication standard, such as a wireless communication protocol, and transmitted to destination device 14. The communication medium may comprise any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 12 to destination device 14.

Storage device 32 may include any of a variety of distributed or locally accessed data storage media such as a hard drive, Blu-ray discs, DVDs, CD-ROMs, flash memory, volatile or non-volatile memory, or any other suitable digital storage media for storing encoded video data. In a further example, storage device 32 may correspond to a file server or another intermediate storage device that may hold the encoded video generated by source device 12. Destination device 14 may access stored video data from storage device 32 via streaming or download. A file server may be any type of server capable of storing encoded video data and transmitting the encoded video data to the destination device 14. Example file servers include a web server (e.g., for a website), an FTP server, network attached storage (NAS) devices, or a local disk drive. Destination device 14 may access the encoded video data through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server.

In the example of FIG. 6, destination device 14 includes an input interface 28, a video decoder 30, and a display device 34. In some cases, input interface 28 may include a receiver and/or a modem. Input interface 28 of destination device 14 receives the encoded video data over link 16 or from storage device 32. The encoded video data communicated over link 16, or provided on storage device 32, may include a variety of syntax elements generated by video encoder 20 for use by a video decoder, such as video decoder 30, in decoding the video data. Such syntax elements may be included with the encoded video data transmitted on a communication medium, stored on a storage medium, or stored a file server.

Display device 34 may be integrated with, or external to, destination device 14. In some examples, destination device 14 may include an integrated display device and may also be configured to interface with an external display device. In other examples, destination device 14 may be a display device. Display device 34 displays the decoded video data to a user, and may comprise any of a variety of display devices such as a liquid crystal display (LCD), a plasma display, an organic light emitting diode (OLED) display, or another type of display device.

Video encoder 20 and video decoder 30 may operate according to a video compression standard, such as the HEVC standard presently under development, as described above, and may generally conform to the HEVC Test Model (HM). Alternatively, video encoder 20 and video decoder 30 may operate according to other proprietary or industry standards, such as the ITU-T H.264 standard or extensions of such standards. The techniques of this disclosure, however, are not limited to any particular coding standard. Further, video encoder 20 and video decoder 30 may operate according to a video compression standard that is modified to incorporate the techniques described herein.

Although not shown in FIG. 6, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

Video encoder 20 and video decoder 30 each may be implemented as any of a variety of suitable encoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder (CODEC) in a respective device.

Figure 7:
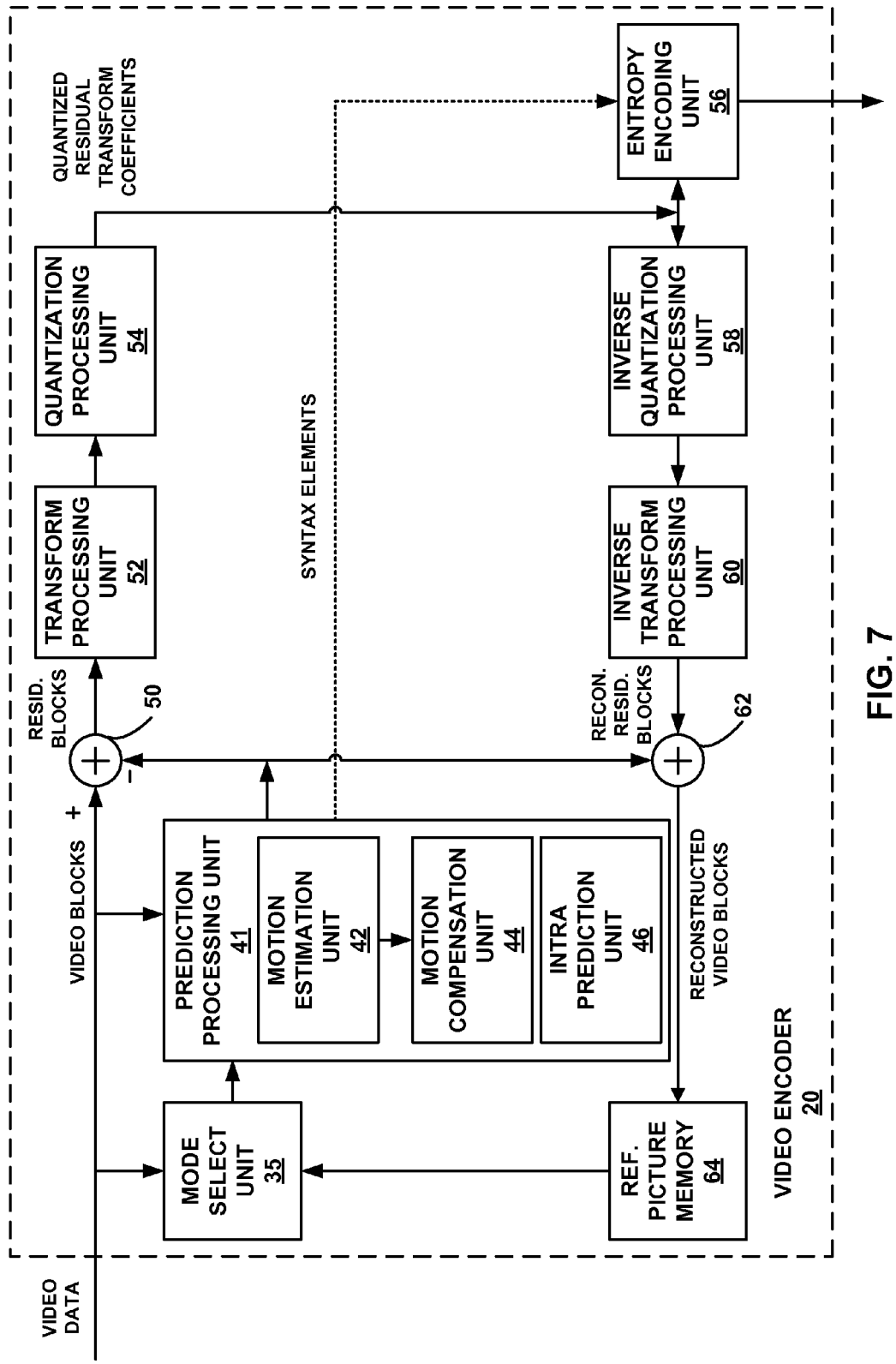
FIG. 7 is a block diagram illustrating an example video encoder that may implement the inter-prediction techniques described in this disclosure.
Figure 8:
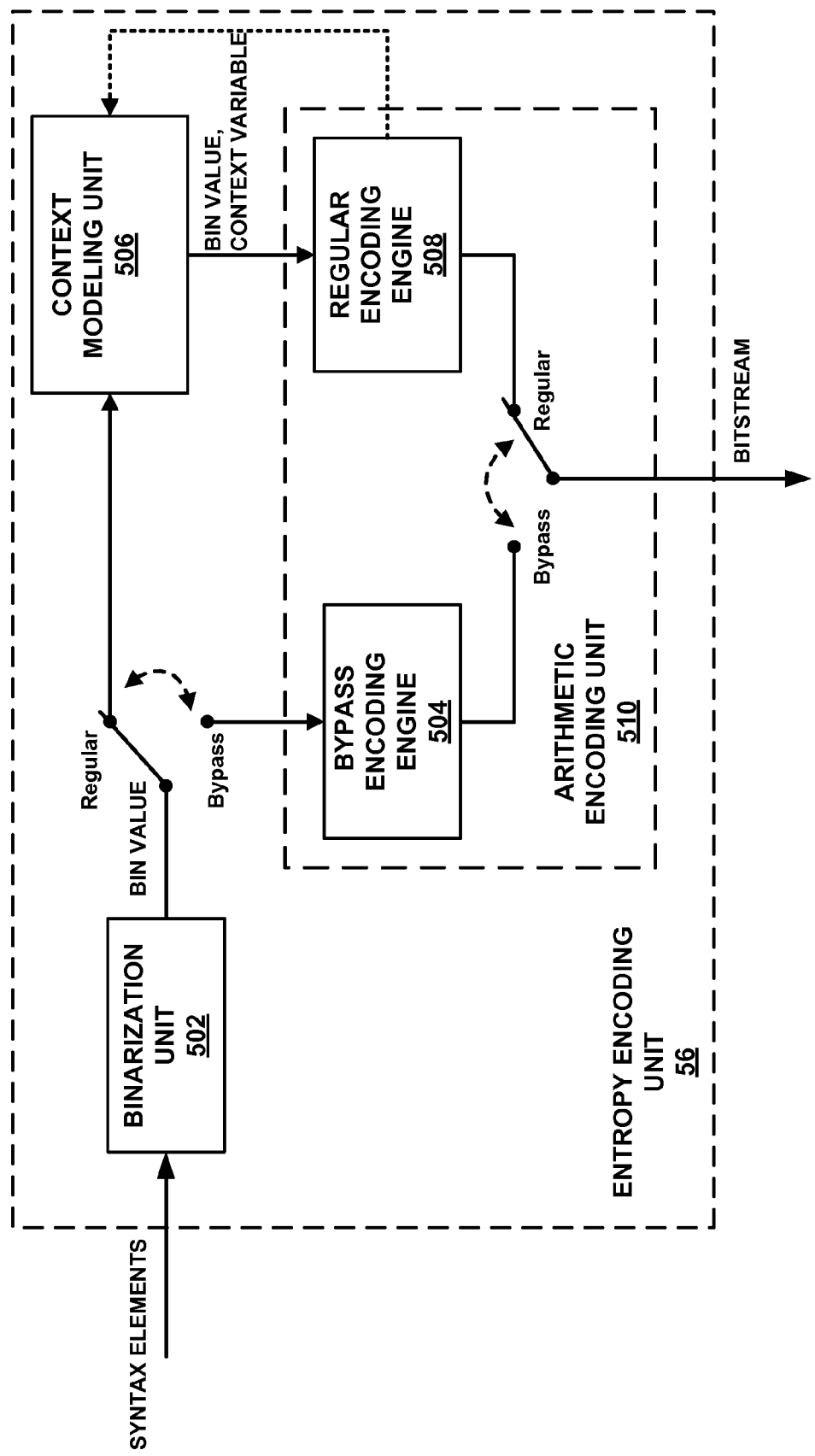
FIG. 8 is a block diagram illustrating an example of an entropy encoder that may implement techniques for entropy encoding predictive syntax elements in accordance with this disclosure.

FIG. 7 is a block diagram illustrating an example video encoder 20 that may implement the techniques described in this disclosure. In the example of FIG. 8, video encoder 20 includes a mode select unit 35, prediction processing unit 41, reference picture memory 64, summer 50, transform processing unit 52, quantization processing unit 54, and entropy encoding unit 56. Prediction processing unit 41 includes motion estimation unit 42, motion compensation unit 44, and intra prediction module 46. For video block reconstruction, video encoder 20 also includes inverse quantization processing unit 58, inverse transform module 60, and summer 62. A deblocking filter (not shown in FIG. 7) may also be included to filter block boundaries to remove blockiness artifacts from reconstructed video. If desired, the deblocking filter would typically filter the output of summer 62. Additional loop filters (in loop or post loop) may also be used in addition to the deblocking filter. It should be noted that prediction processing unit 41 and transform processing unit 52 should not be confused with PUs and TUs as described above.

As shown in FIG. 7, video encoder 20 receives video data, and mode select unit 35 partitions the data into video blocks. This partitioning may also include partitioning into slices, tiles, or other larger units, as well as video block partitioning, e.g., according to a quadtree structure of LCUs and CUs. Video encoder 20 generally illustrates the components that encode video blocks within a video slice to be encoded. A slice may be divided into multiple video blocks (and possibly into sets of video blocks referred to as tiles). Prediction processing unit 41 may select one of a plurality of possible coding modes, such as one of a plurality of intra coding modes or one of a plurality of inter coding modes, for the current video block based on error results (e.g., coding rate and the level of distortion). Prediction processing unit 41 may provide the resulting intra- or inter-coded block to summer 50 to generate residual block data and to summer 62 to reconstruct the encoded block for use as a reference picture.

Intra prediction unit 46 within prediction processing unit 41 may perform intra-predictive coding of the current video block relative to one or more neighboring blocks in the same frame or slice as the current block to be coded to provide spatial compression. Motion estimation unit 42 and motion compensation unit 44 within prediction processing unit 41 perform inter-predictive coding of the current video block relative to one or more predictive blocks in one or more reference pictures to provide temporal compression.

Motion estimation unit 42 may be configured to determine the inter-prediction mode for a video slice according to a predetermined pattern for a video sequence. The predetermined pattern may designate video slices in the sequence as P slices or B slices. Motion estimation unit 42 and motion compensation unit 44 may be highly integrated, but are illustrated separately for conceptual purposes. Motion estimation, performed by motion estimation unit 42, is the process of generating motion vectors, which estimate motion for video blocks. A motion vector, for example, may indicate the displacement of a PU of a video block within a current video frame or picture relative to a predictive block within a reference picture.

A predictive block is a block that is found to closely match the PU of the video block to be coded in terms of pixel difference, which may be determined by sum of absolute difference (SAD), sum of square difference (SSD), or other difference metrics. In some examples, video encoder 20 may calculate values for sub-integer pixel positions of reference pictures stored in reference picture memory 64. For example, video encoder 20 may interpolate values of one-quarter pixel positions, one-eighth pixel positions, or other fractional pixel positions of the reference picture. Therefore, motion estimation unit 42 may perform a motion search relative to the full pixel positions and fractional pixel positions and output a motion vector with fractional pixel precision.

Motion estimation unit 42 calculates a motion vector for a PU of a video block in an inter-coded slice by comparing the position of the PU to the position of a predictive block of a reference picture. The reference picture may be selected from a first reference picture list (List 0) or a second reference picture list (List 1), each of which identify one or more reference pictures stored in reference picture memory 64. Motion estimation unit 42 sends the calculated motion vector to entropy encoding unit 56 and motion compensation unit 44.

Motion compensation, performed by motion compensation unit 44, may involve fetching or generating the predictive block based on the motion vector determined by motion estimation, possibly performing interpolations to sub-pixel precision. Upon receiving the motion vector for the PU of the current video block, motion compensation unit 44 may locate the predictive block to which the motion vector points in one of the reference picture lists. Video encoder 20 forms a residual video block by subtracting pixel values of the predictive block from the pixel values of the current video block being coded, forming pixel difference values. The pixel difference values form residual data for the block, and may include both luma and chroma difference components. Summer 50 represents the component or components that perform this subtraction operation. Motion compensation unit 44 may also generate syntax elements associated with the video blocks and the video slice for use by video decoder 30 in decoding the video blocks of the video slice.

Intra-prediction unit 46 may intra-predict a current block, as an alternative to the inter-prediction performed by motion estimation unit 42 and motion compensation unit 44, as described above. In particular, intra-prediction unit 46 may determine an intra-prediction mode to use to encode a current block. In some examples, intra-prediction unit 46 may encode a current block using various intra-prediction modes, e.g., during separate encoding passes, and intra-prediction unit 46 (or mode select unit 35, in some examples) may select an appropriate intra-prediction mode to use from the tested modes. For example, intra-prediction unit 46 may calculate rate-distortion values using a rate-distortion analysis for the various tested intra-prediction modes, and select the intra-prediction mode having the best rate-distortion characteristics among the tested modes. Rate-distortion analysis generally determines an amount of distortion (or error) between an encoded block and an original, unencoded block that was encoded to produce the encoded block, as well as a bit rate (that is, a number of bits) used to produce the encoded block. Intra-prediction unit 46 may calculate ratios from the distortions and rates for the various encoded blocks to determine which intra-prediction mode exhibits the best rate-distortion value for the block.

In any case, after selecting an intra-prediction mode for a block, intra-prediction unit 46 may provide information indicative of the selected intra-prediction mode for the block to entropy encoding unit 56. Entropy encoding unit 56 may encode the information indicating the selected intra-prediction mode in accordance with the entropy techniques described herein. Video encoder 20 may include in the transmitted bitstream configuration data, which may include a plurality of intra-prediction mode index tables and a plurality of modified intra-prediction mode index tables (also referred to as codeword mapping tables), definitions of encoding contexts for various blocks, and indications of a most probable intra-prediction mode, an intra-prediction mode index table, and a modified intra-prediction mode index table to use for each of the contexts.

After prediction processing unit 41 generates the predictive block for the current video block via either inter-prediction or intra-prediction, video encoder 20 forms a residual video block by subtracting the predictive block from the current video block. The residual video data in the residual block may be included in one or more TUs and applied to transform processing unit 52. Transform processing unit 52 may transform the residual video data into residual transform coefficients using a transform, such as a discrete cosine transform (DCT) or a conceptually similar transform. Transform processing unit 52 may convert the residual video data from a pixel domain to a transform domain, such as a frequency domain. In some cases, transform processing unit 52 may apply a 2-dimensional (2-D) transform (in both the horizontal and vertical direction) to the residual data in the TUs. In some examples, transform processing unit 52 may instead apply a horizontal 1-D transform, a vertical 1-D transform, or no transform to the residual data in each of the TUs.

Transform processing unit 52 may send the resulting transform coefficients to quantization processing unit 54. Quantization processing unit 54 quantizes the transform coefficients to further reduce the bit rate. The quantization process may reduce the bit depth associated with some or all of the coefficients. The degree of quantization may be modified by adjusting a quantization parameter. In some examples, quantization processing unit 54 may then perform a scan of the matrix including the quantized transform coefficients. Alternatively, entropy encoding unit 56 may perform the scan.

As described above, the scan performed on a transform block may be based on the size of the transform block. Quantization processing unit 54 and/or entropy encoding unit 56 may scan 8×8, 16×16, and 32×32 transform blocks using any combination of the sub-block scans described above with respect to FIG. 1, FIGS. 2A-2B, and FIGS. 3A-3B. In one example, 32×32 transform blocks and 16×16 transform blocks may be scanned using the 4×4 diagonal sub-block scan described above with respect to FIG. 1 and 8×8 transform blocks may be scanned using the 4×4 sub-block scans described above with respect to FIG. 1 and FIGS. 3A-3B. When more one than one scan is available for a transform block, entropy encoding unit 56 may select a scan based on a coding parameter associated with the transform block, such as a prediction mode associated with a prediction unit corresponding to the transform block.

Further details with respect to entropy encoding unit 56 are described below with respect to FIG. 8.

Inverse quantization processing unit 58 and inverse transform processing unit 60 apply inverse quantization and inverse transformation, respectively, to reconstruct the residual block in the pixel domain for later use as a reference block of a reference picture. Motion compensation unit 44 may calculate a reference block by adding the residual block to a predictive block of one of the reference pictures within one of the reference picture lists. Motion compensation unit 44 may also apply one or more interpolation filters to the reconstructed residual block to calculate sub-integer pixel values for use in motion estimation. Summer 62 adds the reconstructed residual block to the motion compensated prediction block produced by motion compensation unit 44 to produce a reference block for storage in reference picture memory 64. The reference block may be used by motion estimation unit 42 and motion compensation unit 44 as a reference block to inter-predict a block in a subsequent video frame or picture.

Following quantization, entropy encoding unit 56 entropy encodes the quantized transform coefficients. For example, entropy encoding unit 56 may perform context adaptive variable length coding (CAVLC), context adaptive binary arithmetic coding (CABAC), syntax-based context-adaptive binary arithmetic coding (SBAC), probability interval partitioning entropy (PIPE) coding or another entropy encoding methodology or technique. Following the entropy encoding by entropy encoding unit 56, the encoded bitstream may be transmitted to video decoder 30, or archived for later transmission or retrieval by video decoder 30. Entropy encoding unit 56 may also entropy encode the motion vectors and the other syntax elements for the current video slice being coded. Entropy encoding unit 56 may entropy encode syntax elements such as the significant_coeff_group_flag, significant_coefficient_flag, coeff_abs_level_remain, coeff_abs_level_greater1_flag, coeff_abs_level_greater2_flag, and coeff_sign_flag, syntax elements described above using CABAC.

FIG. 8 is a block diagram that illustrates an example entropy encoding unit 56 that may implement the techniques described in this disclosure. The entropy encoding unit 56 illustrated in FIG. 8 may be a CABAC encoder. The example entropy encoding unit 56 may include a binarization unit 502, an arithmetic encoding unit 510, which includes a bypass encoding engine 504 and a regular encoding engine 508, and a context modeling unit 506.

Entropy encoding unit 56 may receive one or more syntax elements, such as the either of the significant_coeff_group_flag or coded_sub_block_flag syntax elements described above and the significant_coefficient_flag, coeff_abs_level_greater1_flag, coeff_abs_level_greater2_flag, coeff_sign_flag, and the coeff_abs_level_remain syntax elements. Binarization unit 502 receives a syntax element and produces a bin string (i.e., binary string). Binarization unit 502 may use, for example, any one or combination of the following techniques to produce a bin string: fixed length coding, unary coding, truncated unary coding, truncated Rice coding, Golomb coding, exponential Golomb coding, and Golomb-Rice coding. Further, in some cases, binarization unit 502 may receive a syntax element as a binary string and simply pass-through the bin values. In one example, binarization unit 502 receives syntax element significant_coeff_group_flag and produces a bin string.

Arithmetic encoding unit 510 is configured to receive a bin string from binarization unit 502 and perform arithmetic encoding on the bin string. As shown in FIG. 8, arithmetic encoding unit 510 may receive bin values from a bypass path or the regular coding path. Bin values that follow the bypass path may be bins values identified as bypass coded and bin values that follow the regular encoding path may be identified as CABAC-coded. Consistent with the CABAC process described above, in the case where arithmetic encoding unit 510 receives bin values from a bypass path, bypass encoding engine 504 may perform arithmetic encoding on bin values without utilizing an adaptive context assigned to a bin value. In one example, bypass encoding engine 504 may assume equal probabilities for possible values of a bin.

In the case where arithmetic encoding unit 510 receives bin values through the regular path, context modeling unit 506 may provide a context variable (e.g., a context state), such that regular encoding engine 508 may perform arithmetic encoding based on the context assignments provided by context modeling unit 506. The context assignments may be defined according to a video coding standard, such as the upcoming HEVC standard. Further, in one example context modeling unit 506 and/or entropy encoding unit 56 may be configured to assign contexts to bins of the significant_coeff_group_flag and the significant_coefficient_flag syntax elements based on techniques described herein. The techniques may be incorporated into HEVC or another video coding standard. The context models may be stored in memory. Context modeling unit 506 may include a series of indexed tables and/or utilize mapping functions to determine a context and a context variable for a particular bin. After encoding a bin value, regular encoding engine 508 may update a context based on the actual bin values.

As described above, the context assignments illustrated in FIGS. 5A-5D are not optimal for horizontal or vertical 4×4 sub-block scans illustrated in FIGS. 3A-3B. For example, the patterns illustrated in FIG. 5A and FIG. 5D have context assignment regions divided along a diagonal line. These regions do not correspond with the expected location of significant coefficients when a horizontal or vertical 4×4 sub-block scan is applied. Also, the first row of a horizontal 4×4 sub-block scan has a much higher probability of being significant than the second row. In a similar manner, the first column of a vertical 4×4 sub-block scan has a much high probability of being significant than a second column. Therefore, the context patterns illustrated in FIGS. 5A-5D may be modified to provide more optimal content assignments for significant coefficient flags that have been scanned according to a horizontal 4×4 sub-block scan or a vertical 4×4 sub-block scan. Thus, in addition to performing arithmetic encoding based on the context assignments defined according to HEVC WD7, regular encoding engine 508 may be configured to perform arithmetic encoding based on contexts derived according to the techniques disclosed herein.

FIGS. 9A-9D illustrate context patterns that are based on expected positions of significant coefficients with respect to a horizontal 4×4 sub-block scan or a vertical 4×4 sub-block scan. It should be noted that in FIGS. 9A-9D, as with the context patterns illustrated in FIGS. 5A-5D, although the context numbering starts with 0, this is for illustration purposes and does not reflect the actual context numbers, but only relative context numbering. FIGS. 9A-9D illustrate four different patterns that may be used for context assignments of significant coefficient flags of a 4×4 sub-block depending on $CGF_R$ and $CGF_B$, where $CGF_R$ refers to the context group flag for the right coding group (i.e., right sub-block), and $CGF_B$ refers to the context group flag for the below coding group (i.e., below sub-block). Again, the context group flag syntax element indicates whether any of the transform coefficients of a coding group are non-zero.

In accordance with the techniques described in this disclosure, video encoder 20 selects a context pattern for encoding significance syntax elements, and video decoder 30 selects a context pattern for decoding significance syntax elements. FIGS. 9A-9D illustrate examples of a plurality of two-dimensional context pattern from which video encoder 20 and video decoder 30 may select a context pattern for encoding and decoding. In some examples, video encoder 20 and video decoder 30 may select a context pattern from the same context patterns (e.g., those illustrated in FIGS. 9A-9D) for a plurality of scan types. For example, for a horizontal scan, video encoder 20 and video decoder 30 may select from the same context patterns. For a vertical scan, video encoder 20 and video decoder 30 may select from the same context patterns as those for the horizontal scan. For a diagonal scan, video encoder 20 and video decoder 30 may select from the same context patterns as those for the horizontal scan and the vertical scan.

In general the context patterns illustrated in FIGS. 9A-9D can be said to have less diagonal assignment behavior and more row/column-wise assignment behavior when compared to the respective patterns illustrated in FIGS. 5A-5D. Entropy encoding unit 56 may be configured to assign contexts to the significant_coefficient_flag syntax elements based on the context patterns illustrated in FIGS. 9A-9D.

As illustrated in FIGS. 9A-9D, each context pattern includes 16 context values, where each context value corresponds to the coefficient located in the respective position. It should be noted that the context pattern in FIG. 9D (i.e., for $CGF_B=1$, $CGF_R=1$) is uniform for all the positions (i.e., context=2). FIG. 9D can be contrasted with FIG. 5D, where the context pattern is not uniform. Further, the context patterns for $CGF_B=0$, $CGF_R=1$, illustrated in FIG. 9B, and $CGF_B=1$, $CGF_R=0$, illustrated in FIG. 9C, give more importance to the first row and column, respectively, than the context patterns illustrated in FIG. 5B and FIG. 5C. Also, the context pattern for $CGF_B=0$, $CGF_R=0$, illustrated in FIG. 9A, is more square-shaped and gives more importance to the top-left coefficient in comparison to the context pattern illustrated in FIG. 5A.

In one example, entropy encoding unit 56 may be configured to assign contexts to the significant_coefficient_flag syntax elements based on the context patterns illustrated in FIGS. 9A-9D for the horizontal and vertical 4×4 sub-block scans and assign contexts to the significant_coefficient_flag syntax elements based on the context patterns illustrated in FIGS. 5A-5D for the diagonal 4×4 sub-block scan. In another example, in order to limit the total number of context patterns, entropy encoding unit 56 may be configured to assign contexts to the significant_coefficient_flag syntax elements based on the context patterns illustrated in FIGS. 9A-9D for the all of the diagonal, horizontal, and vertical 4×4 sub-block scans.

Further, combinations of the context patterns illustrated in FIGS. 5A-5D and 9A-9D may be used to assign contexts for the significant_coefficient_flag syntax elements. For example, horizontal 4×4 sub-block scans may use the context patterns illustrated in FIG. 5A, FIG. 9B, FIGS. 5C, and 9D for respective values of $CGF_B$ and $CBF_R$. In this example, the horizontal 4×4 sub-block scan does not use a pattern with vertical characteristics (i.e., the pattern illustrated in FIG. 9C). This may improve coding, because the statistics of a horizontal scan usually do not match the distribution illustrated in FIG. 9C. In another example, for the horizontal 4×4 sub-block scan instead of using the pattern illustrated in FIG. 9C for the case where the case (CGF$_B$=1, CBF$_R$=0), the pattern illustrated in FIG. 9D may be used for both the case (CGF$_B$=1, CBF$_R$=0) and the case (CGF$_B$=1, CBF$_R$=1). In this example, there is pattern sharing for different CGF configurations for a give scan. Such pattern sharing may also be applied to the other scan types.

As described above, in one example, quantization processing unit 54 and/or entropy encoding unit 56 may scan 32×32 transform blocks and 16×16 transform blocks using the 4×4 diagonal sub-block scan described above with respect to FIG. 1 and 8×8 transform blocks may be scanned using the 4×4 sub-block scans described above with respect to FIG. 1 and FIGS. 3A and 3B. In one example, entropy encoding unit 56 may be configured to assign contexts to the significant_coefficient_flag syntax elements for 32×32 and 16×16 transform blocks based on the context patterns used for assigning context to the significant_coefficient_flag syntax elements based on the context patterns used for the 8×8 transform blocks.

In one example, entropy encoding unit 56 may use the context patterns illustrated in FIGS. 9A-9D to derive contexts for each of the 32×32, 16×16, and 8×8 transforms blocks. In another example, entropy encoding unit 56 may use the a set of context patterns, such as those illustrated in FIGS. 5A-5B, to derive contexts for 32×32, 16×16, and 8×8 transforms blocks when the 4×4 diagonal sub-block scan is applied and use a different set of context patterns, such as those illustrated in FIGS. 9A-9D, to derive the contexts for an 8×8 transform block when either of the 4×4 horizontal or vertical sub-block scan is applied. In this example, the derivation of contexts may be shared for TUs of varying sizes and may depend on the scan type.

Further, in a matter similar to the case on deriving and assigning contexts to DC and non-DC sub-blocks, although context derivation may be shared for each of 32×32, 16×16, and 8×8 transforms blocks, the actual contexts may defer for each size transform block. For example, each of the actual contexts used for 32×32, 16×16, and 8×8 transform blocks may be based on the context patterns illustrated in FIGS. 5A-5B, but an offset may be applied to the each of the context patterns based on the size of the TU. In this example, each of the 32×32, 16×16, and 8×8 transform blocks would share a context derivation, but not actual contexts. In another example, the context derivation may be the same for all sub-blocks regardless of TUs size or scan type (e.g., the patterns illustrated in FIGS. 9A-9D may be used for all cases), but there may be three sets of actual contexts, one set of contexts for the large TUs (16×16 and 32×32), one set of contexts for the 8×8 TU with diagonal scan, and one set of contexts for the 8×8 TU when using the horizontal or vertical scan. The sets may be defines by applying different offsets to a set of context patterns. Thus, context modeling unit 506 and/or entropy encoding unit 56 may be configured to assign contexts to the significant_coefficient_flag using a unified context derivation for all scanning orders.

As described above, a different set of contexts may be assigned to the significant_coefficient_flag for the DC sub-block than for non-DC sub-blocks. That is, offsets may be applied to context patterns when determining the actual contexts. The reason for this is that the statistics for the DC sub-block are typically much different than the statistics for non-DC sub-blocks when a 4×4 diagonal sub-block scan is used. However, when sub-blocks are scanned using a 4×4 horizontal or vertical sub-block scan, the statistics for the DC sub-block and a non-DC sub-block may be similar. For example, for an 8×8 TU that uses a horizontal sub-block scan, the sub-block to the right of the DC sub-block may have statistics that are more similar to the DC sub-block than to the other non-DC sub-blocks. Similarly, for the vertical scan, the sub-block below the DC sub-block may have statistics that are more similar to the DC sub-block than to the other non-DC sub-blocks.

In order to compensate for the fact that one of the non-DC sub-blocks may have statistics that are similar to the DC sub-block, context modeling unit 506 and/or entropy encoding unit 56 may be configured to use a first set of contexts for the DC sub-block and an adjacent non-DC sub-block, and a second set of contexts may be used to assign contexts for the other non-DC sub-blocks. For example, when a horizontal 4×4 sub-block scan is used for an 8×8 TU, context modeling unit 506 and/or entropy encoding unit 56 may be configured to use a first set of contexts to assign contexts to the first row of sub-blocks and a second set of contexts to assign contexts to the second row of the sub-blocks. For example, context modeling unit 506 and/or entropy encoding unit 56 may be configured to use the context patterns illustrated in FIGS. 5A-5D and the context patterns illustrated in FIGS. 9A-9D for the second row. Further, offsets may still be applied for the non-DC sub-blocks, such that the DC sub-block may still have a unique context set. In a similar manner, for a vertical sub-block scan type context patterns may be assigned on a column basis. Further, this concept can be extended to larger TU with more than two columns or rows. The technique of deriving and assigning context based on the row or column of sub-block may be applied for TUs of all sizes. Thus, context modeling unit 506 and/or entropy encoding unit 56 may be configured to assign contexts to the significant_coefficient_flag based on a sub-block scan type and the location of a sub-block within a transform block.

As described above, FIGS. 9A-9D illustrate example context patterns that video encoder 20 selects for determining the contexts for encoding significance syntax elements of transform coefficients of a sub-block of a transform block. In some examples, for a plurality of scan types of a sub-block (i.e., if the sub-block is to be scanned horizontally, vertically, or diagonally), video encoder 20 may select the context pattern from one of the context patterns illustrated in FIGS. 9A-9D. In other words, the context patterns from which video encoder 20 may select a context pattern may be the same for a plurality of scan types (e.g., a horizontal scan, a vertical scan, and a diagonal scan).

Furthermore, as illustrated in FIGS. 9A-9D, each of the context patterns is associated with a condition of whether one or more neighboring sub-blocks include any non-zero transform coefficients. For example, the one or more neighboring sub-blocks include a first neighboring sub-block and a second neighboring sub-block. In some examples, each of the context patterns is associated with a condition of whether the first neighboring sub-block (e.g., a below sub-block that is below the current sub-block) includes any non-zero transform coefficients and whether the second neighboring sub-block (e.g., a right sub-block that is right of the current sub-block) includes any non-zero transform coefficients. As described above, the CGF$_B$ indicates whether a below sub-block includes any non-zero transform coefficients and the CGF$_R$ indicates whether a right sub-block includes any non-zero transform coefficients.

Video encoder 20 may select one of the context patterns illustrated in FIGS. 9A-9D based on various factors, as described below. In any event, video encoder 20 may assign contexts to each of the significance syntax elements of the transform coefficients based on the selected context pattern.

For example, if video encoder 20 selected the context pattern associated with the condition that the first neighboring sub-block does not include any non-zero transform coefficients and the second neighboring sub-block includes at least one non-zero transform coefficient (i.e., $CGF_B$ equals 0 and $CGF_R$ equals 1), then video encoder 20 may assign a context to a first row of the significance syntax elements of the transform coefficients for the current sub-block that is different than contexts for other rows of the significance elements of the transform coefficients for the current sub-block. For instance, if $CGF_B$ equals 0 and $CGF_R$ equals 1, FIG. 9B illustrates that the first row of transform block is assigned the context of 2 (or 5 assuming an offset of 3) for encoding significance syntax elements of the first row of the sub-block, which is different than the context for any other row of the sub-block.

Video decoder 30 may function in a substantially similar way. For example, if video decoder 30 selects the context pattern illustrated in FIG. 9B (e.g., the condition that $CGF_B$ equals 0 and $CGF_R$ equals 1), then video decoder 30 assigns contexts to the significance syntax elements of a sub-block of a transform block, accordingly. For instance, similar to video encoder 20, video decoder 30 assigns a context to a first row of the significance syntax elements of the transform coefficients for the current sub-block that is different than contexts for other rows of the significance syntax elements of the transform coefficients for the current sub-block.

As another example, if video encoder 20 selected the context pattern associated with the condition that the first neighboring sub-block includes at least one non-zero transform coefficient and the second neighboring sub-block does not include any non-zero transform coefficients (i.e., $CGF_B$ equals 1 and $CGF_R$ equals 0), then video encoder 20 may assign a context to a first column of the significance syntax elements of the transform coefficients for the current sub-block that is different than contexts for other columns of the significance syntax elements of the transform coefficients for the current sub-block. For instance, if $CGF_B$ equals 1 and $CGF_R$ equals 0, FIG. 9C illustrates that the first column of transform block is assigned the context of 2 (or 5 assuming an offset of 3) for encoding significance syntax elements of the first column of the sub-block, which is different than the context for any other column of the sub-block.

Video decoder 30 may function in a substantially similar way. For example, if video decoder 30 selects the context pattern illustrated in FIG. 9C (e.g., the condition that $CGF_B$ equals 1 and $CGF_R$ equals 0), then video decoder 30 assigns contexts to the significance syntax elements of a sub-block of a transform block, accordingly. For instance, similar to video encoder 20, video decoder 30 assigns a context to a first column of the significance syntax elements of the transform coefficients for the current sub-block that is different than contexts for other columns of the significance elements of the transform coefficients for the current sub-block.

As another example, if video encoder 20 selected the context pattern associated with the condition that the first neighboring sub-block includes at least one non-zero transform coefficient and the second neighboring sub-block includes at least one non-zero transform coefficient (i.e., $CGF_B$ equals 1 and $CGF_R$ equals 1), then video encoder 20 may assign a same context to the significance syntax elements of the transform coefficients for the current sub-block. For instance, if $CGF_B$ equals 1 and $CGF_R$ equals 1, FIG. 9D illustrates that all the contexts are the same for the significance syntax element (i.e., 2).

Video decoder 30 may function in a substantially similar way. For example, if video decoder 30 selects the context pattern illustrated in FIG. 9D (e.g., the condition that $CGF_B$ equals 1 and $CGF_R$ equals 1), then video decoder 30 assigns contexts to the significance syntax elements of a sub-block of a transform block, accordingly. For instance, similar to video encoder 20, video decoder 30 assigns a same context to the significance elements of the transform coefficients for the current sub-block.

If $CGF_B$ equals 0 and $CGF_R$ equals 0, video encoder 20 may select the context pattern illustrated in FIG. 9A, and assign contexts to the significance syntax elements of a sub-block of a transform block, accordingly. Video decoder 30 may function in a substantially similar manner if $CGF_B$ equals 0 and $CGF_R$ equals 0.

Furthermore, the context patterns illustrated in FIGS. 9A-9D may include characteristics in addition to those described above. For example, one of the characteristics of the context pattern (e.g., when $CGF_B$ equals 0 and $CGF_R$ equals 0) is that the context pattern includes contexts that if scanned horizontally or vertically result in a same one-dimensional vector.

For instance, if the context pattern illustrated in FIG. 9A is scanned horizontally from the bottom-right to the top-left, the resulting one-dimensional vector is: [0 0 0 0 0 1 1 1 0 1 1 1 0 1 1 2]. If the context pattern illustrated in FIG. 9A is scanned vertically from the bottom-right to the top-left, the resulting one-dimensional vector is: [0 0 0 0 0 1 1 1 0 1 1 0 1 1 2]. As can be seen, these two one-dimensional vectors are the same.

As another example of the characteristics of the context patterns, two of the context patterns are transposes of one another such that a horizontal scan of one of the context patterns and a vertical scan of another one of the context patterns results in the same one-dimensional vector. For example, a horizontal scan of the context pattern illustrated in FIG. 9B from bottom-right to top-left results in the one-dimensional vector: [0 0 0 0 0 0 0 1 1 1 1 2 2 2 2]. A vertical scan of the context pattern illustrated in FIG. 9C from bottom-right to top-left results in the one-dimensional vector: [0 0 0 0 0 0 0 1 1 1 1 2 2 2 2]. As can be seen, these two one-dimensional vectors are the same.

As another example of the characteristics of the context patterns, one of the context patterns includes contexts that if scanned horizontally, vertically, and diagonally result in the same one-dimensional vector. For example, a horizontal scan, a vertical scan, or a diagonal scan of the contexts of the context pattern illustrated in FIG. 9D result in the same one-dimensional vector: [2 2 2 2 2 2 2 2 2 2 2 2 2 2 2].

As described above, video encoder 20 selects one of the context patterns illustrated in FIGS. 9A-9D based on various factors. As one example, video encoder 20 selects the context pattern based on the CGF of the below and right sub-blocks. However, there may be additional factors as well. For instance, video encoder 20 may select the context pattern based on a scan type. If the scan type is a horizontal scan of the sub-block, then video encoder 20 may select the context pattern illustrated in FIG. 9B. If the scan type is a vertical scan of the sub-block, then video encoder 20 may select the context pattern illustrated in FIG. 9C. Video decoder 30 may function in similar manner.

In some examples, as described above, video encoder 20 may exclude context patterns from the content patterns that video encoder 20 evaluates to determine which context pattern to select. For instance, if the scan type of the sub-block is horizontal, then video encoder 20 may determine that the context pattern illustrated in FIG. 9C cannot be selected as the context pattern even if the $CGF_B$ is equal to 1 and the $CGF_R$ is equal 0. In this case, video encoder 20 may select the context pattern illustrated in FIG. 9D. For example, if the scan type of the sub-block is horizontal, then video encoder 20 may exclude the context pattern illustrated in FIG. 9C. From the remaining context patterns, video encoder 20 may select the context pattern illustrated in FIG. 9D. In this case, there may be context pattern sharing for different values of $CGF_B$ and $CGF_R$. For example, for the horizontal scan, video encoder 20 may select the context pattern illustrated in FIG. 9D if $CGF_B$ equals 0 and $CGF_R$ equals 1 or if $CGF_B$ equals 1 and $CGF_R$ equals 1.

For a scan type of a vertical scan, video encoder 20 may function in a similar way, except video encoder 20 may exclude the context pattern illustrated in FIG. 9B even if $CGF_B$ equals 0 and $CGF_R$ equals 1. In this example, video encoder 20 selects the context pattern from the remaining plurality of context patterns. Video decoder 30 functions in a similar way.

For example, video encoder 20 and video decoder 30 determine the scan type of the current sub-block, and determine at least one context pattern from the plurality of context patterns that cannot be selected as the context pattern based on the determined scan type of the current sub-block. Video encoder 20 and video decoder 30 select the context pattern based on the plurality of context patterns excluding the determined at least one context pattern. In some examples, video encoder 20 and video decoder 30 select the context pattern based on the plurality of context patterns excluding the determined at least one context pattern regardless of whether the below neighboring sub-block includes any non-zero transform coefficients and whether the right neighboring sub-block includes any non-zero transform coefficients.

In FIGS. 5A-5D and FIGS. 9A-9D, context patterns are illustrated and defined as 2-D blocks. However, in some practical implementations, a video encoder, such as video encoder 20, might represent a 2-D block as a 1-D vector according to the selected sub-block scan type and store the 1-D vector in order to speed up the context assignment process. In this situation, even if the same 2-D context pattern is used to assign contexts for sub-blocks that used different sub-block scan types, different 1-D vectors may be obtained based on the selected sub-block scan type. For example, 1-D vector of the context pattern illustrated in FIG. 9C scanned according to a horizontal scan would have the following 1-D vector representation:

Scan Pattern=[2 1 0 0 2 1 0 0 2 1 0 0 2 1 0 0]

whereas the context pattern illustrated in FIG. 9C scanned according to a vertical scan would have the following 1-D vector representation:

Scan Pattern=[2 2 2 2 1 1 1 1 0 0 0 0 0 0 0 0]

In this case, if a video encoder, such as video encoder 20, stores context patterns as 1-D vectors (i.e., one-dimensional context patterns), there may be several vectors for each context pattern. One way to overcome the storage of several different 1-D vectors for each context pattern is by defining the context patterns directly as 1-D vectors (i.e., one-dimensional context patterns) and using the same vector for two or more sub-block scan types. For example, context patterns with a constant value (i.e., all 2's) provide the same scan 1-D regardless of scan type. In this example, a 1-D vector may specify a same context (e.g., 2) or all of the significance syntax elements. The 1-D vector may be represented as follows:

Scan Pattern=[2 2 2 2 2 2 2 2 2 2 2 2 2 2 2 2]

In another example, the one-dimensional context pattern defines a first context for a first significance syntax element in a scan order, defines a second context for a second and a third significance syntax element in the scan order, and defines a third context for remaining significance syntax elements in the scan order. For instance, a 1-D vector may specify a context of 2 for the first significant coefficient flag, specify a context of 1 for the second and third assignments, and specify a context of 0 for remaining assignments and may be represented as follows:

Scan Pattern=[2 1 1 0 0 0 0 0 0 0 0 0 0 0 0 0]

Figure 10:
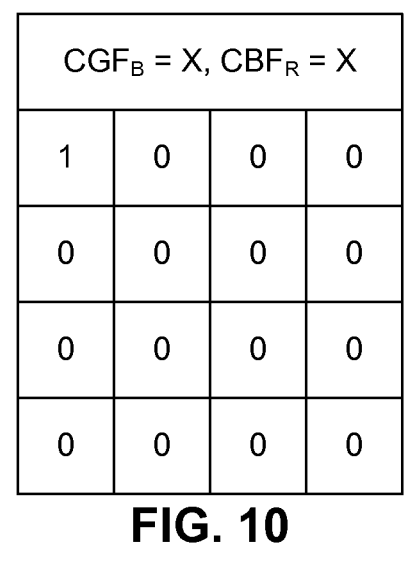

Another possible context pattern is Scan Pattern=[1 0 0 0 0 0 0 0 0 0 0 0 0 0 0 0]. In this example, the context pattern defines a first context (e.g., 1) for a first significance syntax element in a scan order, and defines a second context (e.g., 0) for remaining significance syntax elements in the scan order. FIG. 10 is a conceptual diagram that illustrates an example of a pattern for context assignment for coefficients in a sub-block. The resulting scan pattern for the context pattern illustrated in FIG. 10, is the same for the diagonal, horizontal and vertical 4×4 sub-block scans as defined above. Context modeling unit 506 and/or entropy encoding unit 56 may be configured to store context patterns as 1-D vectors (i.e., one-dimensional context patterns). In one example, the same stored scan pattern may be used to assign contexts to the significant_coefficient_flag for a plurality of sub-block scan types, such as, the diagonal, horizontal and vertical 4×4 sub-block scans.

In some examples, the one-dimensional context patterns may be pre-computed from two-dimensional context patterns such as those illustrated in FIGS. 9A-9D. For example, the context patterns illustrated in FIGS. 9A-9D may be horizontally, vertically, and diagonally scanned to produce the one-dimensional context patterns. Accordingly, in this example, there may be up to 12 one-dimensional context patterns. However, the characteristics of the context patterns illustrated in FIGS. 9A-9D may be such that less than 12 one-dimensional context patterns are pre-computed and stored.

For example, as described above, the horizontal scan and vertical scan of the context pattern illustrated in FIG. 9A results in the same one-dimensional vector. Accordingly, the horizontal, vertical, and diagonal scan of the context pattern illustrated in FIG. 9A results in two unique one-dimensional context patterns, instead of three.

Also, for the context patterns illustrated in FIGS. 9B and 9C, for one of them there may be three unique one-dimensional context patterns (i.e., one for each scan type). However, for the other, there may be only two unique one-dimensional context patterns. This is because the horizontal scan of the context pattern illustrated in FIG. 9B and the vertical scan of the context pattern illustrated in FIG. 9C results in the same one-dimensional context pattern. Accordingly, there are a total of five unique one-dimensional context patterns between the context patterns illustrated in FIGS. 9B and 9C. In other words, the one of the plurality of one-dimensional context patterns is pre-computed from the context pattern illustrated in FIG. 9B (e.g., a first two-dimensional context pattern). The first two-dimensional context pattern includes contexts that if scanned horizontally result in a same one-dimensional context pattern when a second two-dimensional context pattern is scanned vertically. One example of the second two-dimensional context pattern, when the first two-dimensional pattern is illustrated in FIG. 9B, is the two-dimensional context pattern illustrated in FIG. 9C.

For the context pattern illustrated in FIG. 9D, there is only one unique one-dimensional context pattern (i.e., the diagonal, horizontal, and vertical scans all results in the same one-dimensional context pattern). For example, when the context pattern illustrated in FIG. 9D is used to pre-compute a one-dimensional pattern, the resulting one-dimensional pattern (whether scanned vertically, horizontally, or diagonally) results in a context pattern that defines a same context (e.g., 2) for all of the significance syntax elements of transform coefficients of a sub-block. Therefore, the characteristics of the context patterns illustrated in FIGS. 9A-9D result in a total of eight one-dimensional context patterns (i.e., two from FIG. 9A, five from FIGS. 9B and 9C, and one from FIG. 9D), which is less than the 12 one-dimensional context patterns that would have been needed to be stored if the context patterns did not comprise the characteristics of the context patterns illustrated in FIGS. 9A-9D.

As described above, in addition to assigning contexts to the significant_coefficient_flag syntax elements in one example context modeling unit 506 and/or entropy encoding unit 56 may be configured to assign contexts to the significant_coeff_group_flag. As describe above, in HEVC WD7 the context derivation of significant_coeff_group_flag depends on the scan order (i.e., whether a diagonal 4×4, a non-square horizontal, or vertical scan is applied). In the case, where the non-square scans are replaced with the scans illustrated in FIGS. 3A-3B, the context derivation of significant_coeff_group_flag may be modified from the context derivation described in HEVC WD7. In one example, context modeling unit 506 and/or entropy encoding unit 56 may be configured to assign contexts to the significant_coeff_group_flag using the same context derivation for all of the sub-blocks regardless of the scan type and the size of the TUs associated with the sub-block. However, in one example, the actual context assigned to the significant_coeff_group_flag may differ based on whether a sub-block is scanned using the diagonal, horizontal and vertical 4×4 sub-block scans. In one example, a first set of contexts may be used for assigning context to significant_coeff_group_flag when the 4×4 diagonal scan is applied and second set of contexts may be used for assigning contexts to significant_coeff_group_flag when the horizontal or vertical 4×4 sub-block scans are applied. In one example, the second set of contexts may be derived by adding an offset may to the first context set.

Thus, there are several techniques that context modeling unit 506 and/or entropy encoding unit 56 used to assign contexts to the significant_coeff_group_flag and significant_coefficient_flag syntax elements. Entropy encoding unit 56 may be configured to assign contexts to the significant_coeff_group_flag and significant_coefficient_flag syntax elements using any combination of the techniques described above.

Figure 11:
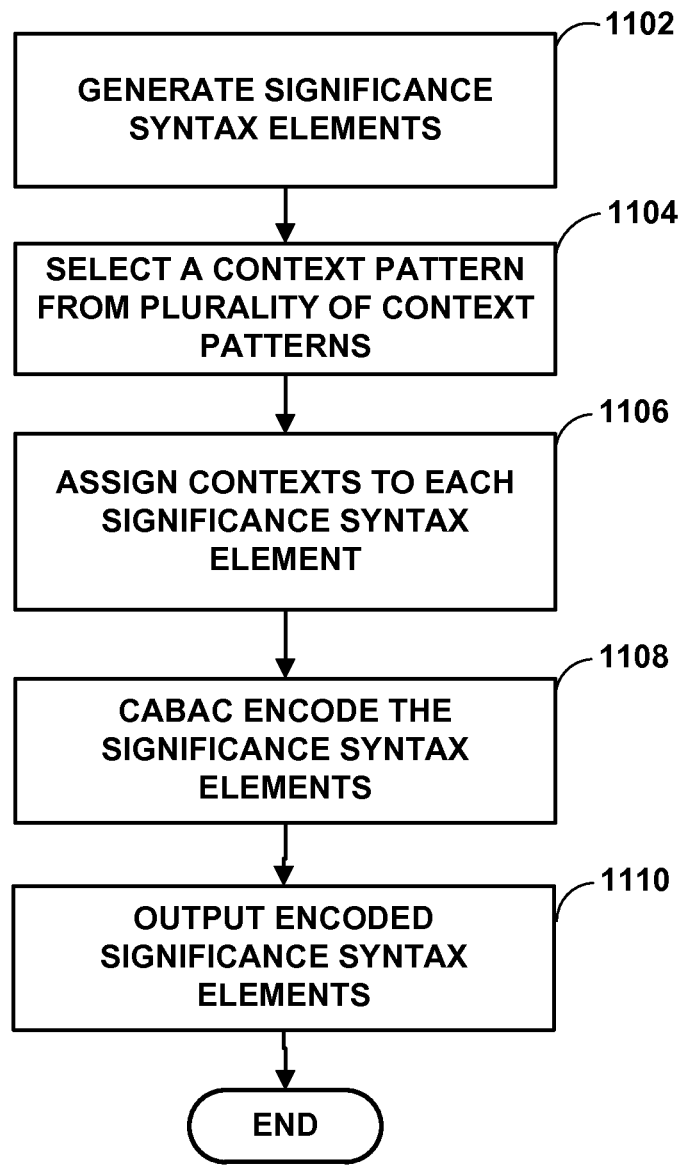
FIG. 11 is a flowchart illustrating encoding predictive syntax elements according to the techniques of this disclosure.

FIG. 11 is a flowchart illustrating an example of encoding video data according to the techniques of this disclosure. Although the process in FIG. 11 is described below as generally being performed by video encoder 20, the process may be performed by any combination of video encoder 20, entropy encoding unit 56, and/or context modeling unit 506.

As illustrated in FIG. 11, video encoder 20 generates significance syntax elements for transform coefficients of a current sub-block of a block (1102). The significance syntax element (e.g., significance coefficient flag) of a transform coefficient indicates whether the value of the transform coefficient is zero (i.e., a zero transform coefficient) or non-zero (i.e., a non-zero transform coefficient). In some examples, the sub-block is a 4×4 sub-block, and the block is an 8×8 transform block.

Video encoder 20 selects a context pattern from a same plurality of two-dimensional context patterns for a plurality of scan types (e.g., a horizontal scan, a vertical scan, and a diagonal scan) for the significance syntax elements of the transform coefficients of the current sub-block (1104). Examples of the context patterns include the context patterns illustrated in FIGS. 9A-9D. In the techniques described in this disclosure, video encoder 20 may select from the same plurality of two-dimensional context patterns if the sub-block is scanned horizontally, vertically, or diagonally. In other words, the scan type is horizontal or vertical, video encoder 20 selects from among the same plurality of two-dimensional context patterns that video encoder 20 selects from if the scan type is diagonal.

Also, as described above, each of the context patterns is associated with a condition of whether one or more neighboring sub-blocks include any non-zero transform coefficients. For example, the one or more neighboring sub-blocks include a first neighboring sub-block and a second neighboring sub-block, and each of the context patterns may be associated with a condition of whether the first neighboring sub-block includes any non-zero transform coefficients and whether the second neighboring sub-block includes any non-zero transform coefficients (i.e., each context is associated with a condition of whether the value of $CGF_B$ and $CGF_R$ is 1 or 0).

Video encoder 20 assigns contexts to each of the significance syntax elements of the transform coefficient based on the selected context pattern (1106). For example, as described above, if video encoder 20 selects the context pattern associated with the condition that $CGF_B$ equals 0 and $CGF_R$ equals 1 (i.e., the below sub-block does not include any non-zero transform coefficients and the right block includes at least one non-zero transform coefficient), then video encoder 20 assigns a context (e.g., context 2 or 5 with offset of 3) to a first row of the significance syntax elements of the sub-block that is different than the context for the other rows.

If video encoder 20 selects the context pattern associated with the condition that $CGF_B$ equals 1 and $CGF_R$ equals 0 (i.e., the below sub-block includes at least one non-zero transform coefficient and the right block does not include any non-zero transform coefficients), then video encoder 20 assigns a context (e.g., context 2 or 5 with offset of 3) to a column of the significance syntax elements of the sub-block that is different than the context for the other columns. If video encoder 20 selects the context pattern associated with the condition that $CGF_B$ equals 1 and $CGF_R$ equals 1 (i.e., the below sub-block includes at least non-zero transform coefficient and the right block includes at least one non-zero transform coefficient), then video encoder 20 assigns a same context (e.g., context 2 or 5 with offset of 3) to the significance syntax elements of the current sub-block.

Video encoder 20 CABAC encodes the significance syntax elements based on the assigned contexts (1108). Video encoder 20 outputs the encoded significance syntax elements as part of the encoded bitstream (1110).

Figure 12:
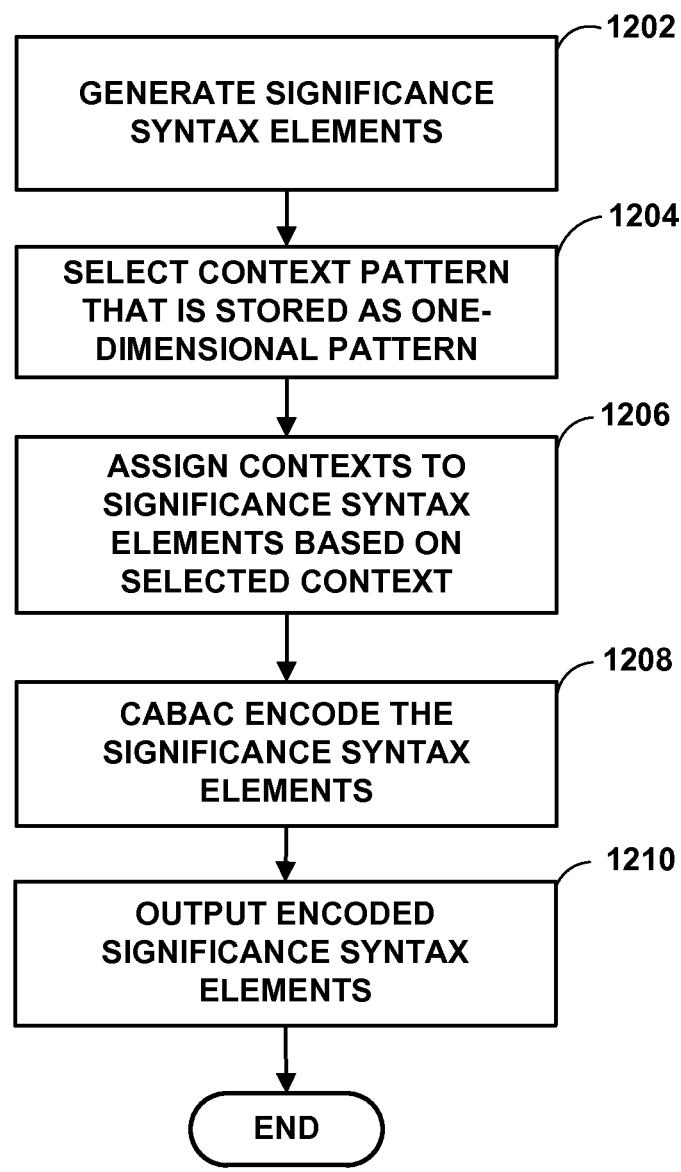
FIG. 12 is a flowchart illustrating encoding predictive syntax elements according to the techniques of this disclosure.

FIG. 12 is a flowchart illustrating an example of encoding video data according to the techniques of this disclosure. Although the process in FIG. 12 is described below as generally being performed by video encoder 20, the process may be performed by any combination of video encoder 20, entropy encoding unit 56, and/or context modeling unit 506.

As illustrated in FIG. 12, video encoder 20 generates significance syntax elements for transform coefficients of a current sub-block of a block (1202). The significance syntax element (e.g., significance coefficient flag) of a transform coefficient indicates whether the value of the transform coefficient is zero (i.e., a zero transform coefficient) or non-zero (i.e., a non-zero transform coefficient). In some examples, the sub-block is a 4×4 sub-block, and the block is an 8×8 transform block.

Video encoder 20 selects a context pattern that is stored as a one-dimensional context pattern (1204). In some examples, the context pattern identifies contexts for two or more scan types of the current sub-block. For instance, the selected context pattern is for a scan type of a horizontal scan, a vertical scan, and a diagonal scan.

As one example, the selected context pattern defines a first context for a first significance syntax element in a scan order, defines a second context for a second and a third significance syntax element in the scan order, and defines a third context for remaining significance syntax elements in the scan order. As another example, the selected context pattern defines a first context for a first significance syntax element in a scan order, and defines a second context for remaining significance syntax elements in the scan order. As another example, the selected context pattern defines a same context for all of the significance syntax elements.

In some examples, the selected context pattern is selected from a plurality of context patterns that are stored as one-dimensional context patterns. For example, the plurality of context patterns are pre-computed and stored from the two-dimensional context patterns illustrated in FIGS. 9A-9D. As one example, one of the plurality of contexts patterns is pre-computed from a two-dimensional context pattern that includes contexts that if scanned horizontally or vertically results in a same one-dimensional context pattern. One example of such a two-dimensional context pattern is the context pattern illustrated in FIG. 9A. As another example, one of the plurality of contexts patterns is pre-computed from a two-dimensional context pattern that includes contexts that if scanned horizontally, vertically, or diagonally all result in the same one-dimensional context pattern. One example of such a two-dimensional context pattern is the context pattern illustrated in FIG. 9D.

As another example, one of the plurality of context patterns is pre-computed from a first two-dimensional context pattern that includes contexts that if scanned horizontally result in a same one-dimensional context pattern as when a second two-dimensional context pattern is scanned vertically. One example of the first two-dimensional context pattern is the context pattern illustrated in FIG. 9B. One example of the second two-dimensional context patter is the context pattern illustrated in FIG. 9C.

Video encoder 20 assigns contexts to significance syntax elements based on the selected context (1206). Video encoder 20 CABAC encodes the significance syntax elements based on the assigned contexts (1208). Video encoder 20 outputs the encoded significance syntax elements as part of the encoded bitstream (1210).

Figure 13:
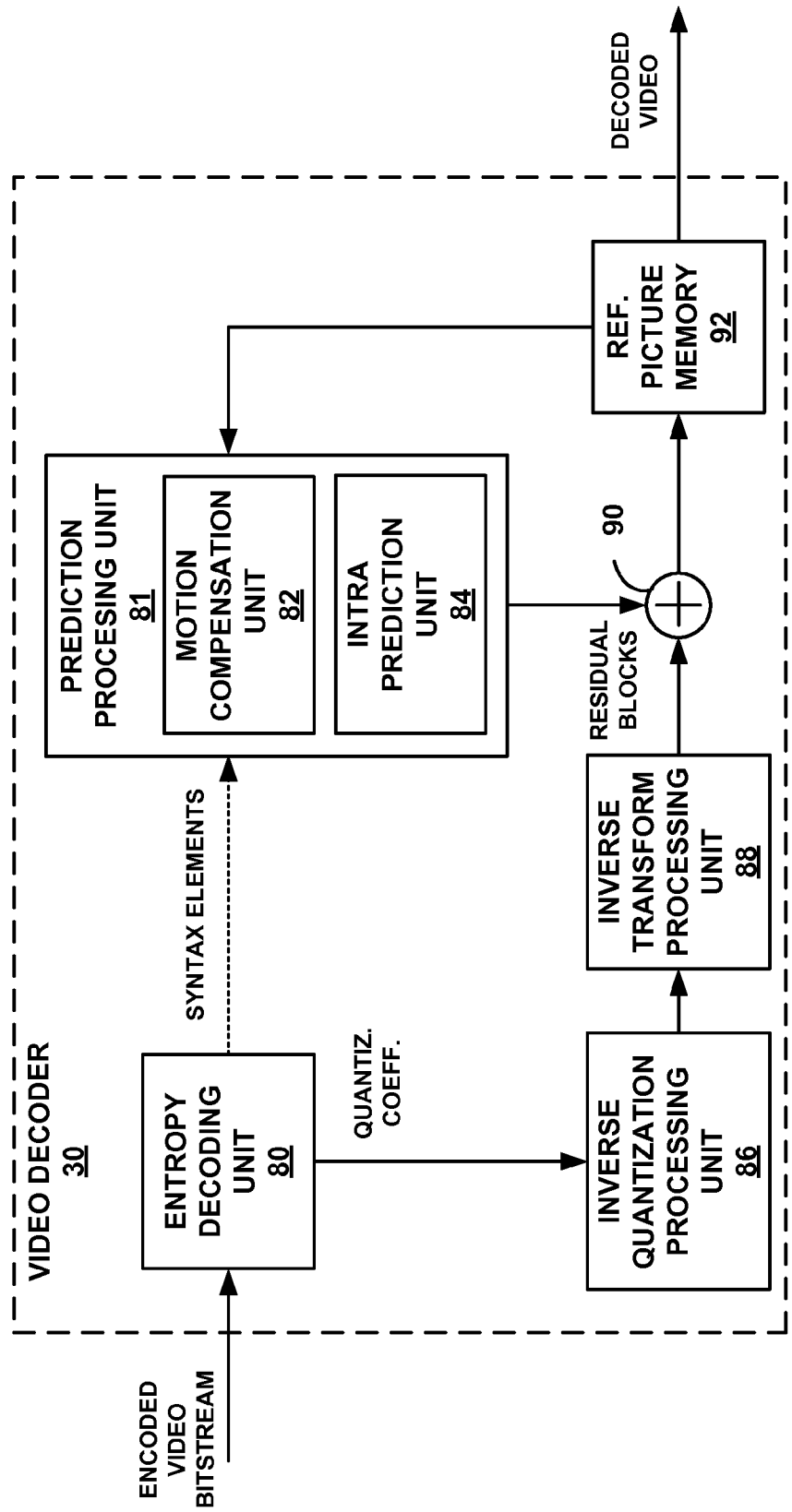
FIG. 13 is a block diagram illustrating an example video decoder that may implement the inter-prediction techniques described in this disclosure.

FIG. 13 is a block diagram illustrating an example video decoder 30 that may implement the techniques described in this disclosure. In the example of FIG. 13, video decoder 30 includes an entropy decoding unit 80, prediction processing unit 81, inverse quantization processing unit 86, inverse transform processing unit 88, summer 90, and reference picture memory 92. Prediction processing unit 81 includes motion compensation unit 82 and intra prediction module 84. Video decoder 30 may, in some examples, perform a decoding pass generally reciprocal to the encoding pass described with respect to video encoder 20 from FIG. 7.

During the decoding process, video decoder 30 receives an encoded video bitstream that represents video blocks of an encoded video slice and associated syntax elements from video encoder 20. Entropy decoding unit 80 of video decoder 30 entropy decodes the bitstream to generate quantized coefficients, motion vectors, and other syntax elements. Entropy decoding unit 80 forwards the motion vectors and other syntax elements to prediction module 81. Video decoder 30 may receive the syntax elements at the video slice level and/or the video block level.

Figure 14:
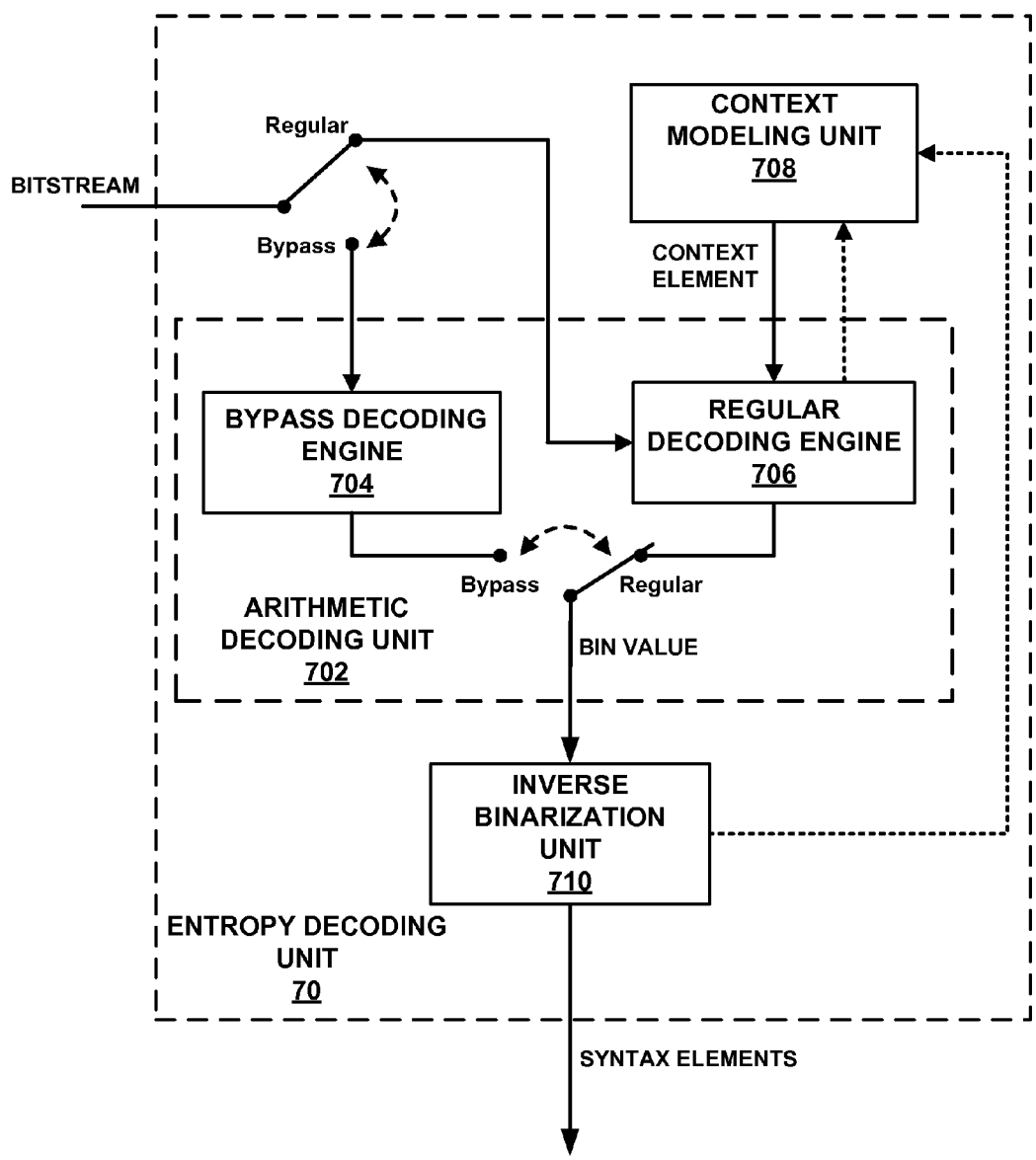
FIG. 14 is a block diagram illustrating an example of an entropy decoder that may implement techniques for decoding predictive syntax elements in accordance with this disclosure.

FIG. 14 is a block diagram that illustrates an example entropy decoding unit 70 that may implement the techniques described in this disclosure. Entropy decoding unit 70 receives an entropy encoded bitstream and decodes syntax elements from the bitstream. Syntax elements may include the syntax elements significant_coeff_group_flag, significant_coefficient_flag, coeff_abs_level_remain, coeff_abs_level_greater1_flag, coeff_abs_level_greater2_flag, and coeff_sign_flag, syntax elements described above. The example entropy decoding unit 70 in FIG. 14 includes an arithmetic decoding unit 702, which may include a bypass decoding engine 704 and a regular decoding engine 706. The example entropy decoding unit 70 also includes context modeling unit 708 and inverse binarization unit 710. The example entropy decoding unit 70 may perform the reciprocal functions of the example entropy encoding unit 56 described with respect to FIG. 8. In this manner, entropy decoding unit 70 may perform entropy decoding based on the techniques described herein.

Arithmetic decoding unit 702 receives an encoded bit stream. As shown in FIG. 14, arithmetic decoding unit 702 may process encoded bin values according to a bypass path or the regular coding path. An indication whether an encoded bin value should be processed according to a bypass path or a regular pass may be signaled in the bitstream with higher level syntax. Consistent with the CABAC process described above, in the case where arithmetic decoding unit 702 receives bin values from a bypass path, bypass decoding engine 704 may perform arithmetic encoding on bin values without utilizing a context assigned to a bin value. In one example, bypass decoding engine 704 may assume equal probabilities for possible values of a bin.

In the case where arithmetic decoding unit 702 receives bin values through the regular path, context modeling unit 708 may provide a context variable, such that regular decoding engine 706 may perform arithmetic encoding based on the context assignments provided by context modeling unit 708. The context assignments may be defined according to a video coding standard, such as HEVC. The context models may be stored in memory. Context modeling unit 708 may include a series of indexed tables and/or utilize mapping functions to determine a context and a context variable portion of an encoded bitstream. Further, in one example context modeling unit 506 and/or entropy encoding unit 56 may be configured to assign contexts to bins of the significant_coeff_group_flag and the significant_coefficient_flag syntax elements based on techniques described herein. After decoding a bin value, regular coding engine 706, may update a context based on the decoded bin values. Further, inverse binarization unit 710 may perform an inverse binarization on a bin value and use a bin matching function to determine if a bin value is valid. The inverse binarization unit 710 may also update the context modeling unit based on the matching determination. Thus, the inverse binarization unit 710 outputs syntax elements according to a context adaptive decoding technique.

When the video slice is coded as an intra-coded (I) slice, intra prediction module 84 of prediction module 81 may generate prediction data for a video block of the current video slice based on a signaled intra prediction mode and data from previously decoded blocks of the current frame or picture. When the video frame is coded as an inter-coded (i.e., B or P) slice, motion compensation unit 82 of prediction module 81 produces predictive blocks for a video block of the current video slice based on the motion vectors and other syntax elements received from entropy decoding unit 80. The predictive blocks may be produced from one of the reference pictures within one of the reference picture lists. Video decoder 30 may construct the reference frame lists, List 0 and List 1, using default construction techniques based on reference pictures stored in reference picture memory 92.

Motion compensation unit 82 determines prediction information for a video block of the current video slice by parsing the motion vectors and other syntax elements, and uses the prediction information to produce the predictive blocks for the current video block being decoded. For example, motion compensation unit 82 uses some of the received syntax elements to determine a prediction mode (e.g., intra- or inter-prediction) used to code the video blocks of the video slice, an inter-prediction slice type (e.g., B slice or P slice), construction information for one or more of the reference picture lists for the slice, motion vectors for each inter-encoded video block of the slice, inter-prediction status for each inter-coded video block of the slice, and other information to decode the video blocks in the current video slice.

Motion compensation unit 82 may also perform interpolation based on interpolation filters. Motion compensation unit 82 may use interpolation filters as used by video encoder 20 during encoding of the video blocks to calculate interpolated values for sub-integer pixels of reference blocks. In this case, motion compensation unit 82 may determine the interpolation filters used by video encoder 20 from the received syntax elements and use the interpolation filters to produce predictive blocks.

Inverse quantization processing unit 86 inverse quantizes, i.e., de-quantizes, the quantized transform coefficients provided in the bitstream and decoded by entropy decoding unit 80. The inverse quantization process may include use of a quantization parameter calculated by video encoder 20 for each video block in the video slice to determine a degree of quantization and, likewise, a degree of inverse quantization that should be applied. Inverse transform processing unit 88 applies an inverse transform, e.g., an inverse DCT, an inverse integer transform, or a conceptually similar inverse transform process, to the transform coefficients in order to produce residual blocks in the pixel domain.

In some cases, inverse transform processing unit 88 may apply a 2-dimensional (2-D) inverse transform (in both the horizontal and vertical direction) to the coefficients. According to the techniques of this disclosure, inverse transform processing unit 88 may instead apply a horizontal 1-D inverse transform, a vertical 1-D inverse transform, or no transform to the residual data in each of the TUs. The type of transform applied to the residual data at video encoder 20 may be signaled to video decoder 30 to apply an appropriate type of inverse transform to the transform coefficients.

After motion compensation unit 82 generates the predictive block for the current video block based on the motion vectors and other syntax elements, video decoder 30 forms a decoded video block by summing the residual blocks from inverse transform processing unit 88 with the corresponding predictive blocks generated by motion compensation unit 82. Summer 90 represents the component or components that perform this summation operation. If desired, a deblocking filter may also be applied to filter the decoded blocks in order to remove blockiness artifacts. Other loop filters (either in the coding loop or after the coding loop) may also be used to smooth pixel transitions, or otherwise improve the video quality. The decoded video blocks in a given frame or picture are then stored in reference picture memory 92, which stores reference pictures used for subsequent motion compensation. Reference picture memory 92 also stores decoded video for later presentation on a display device, such as display device 34 of FIG. 6.

Figure 15:
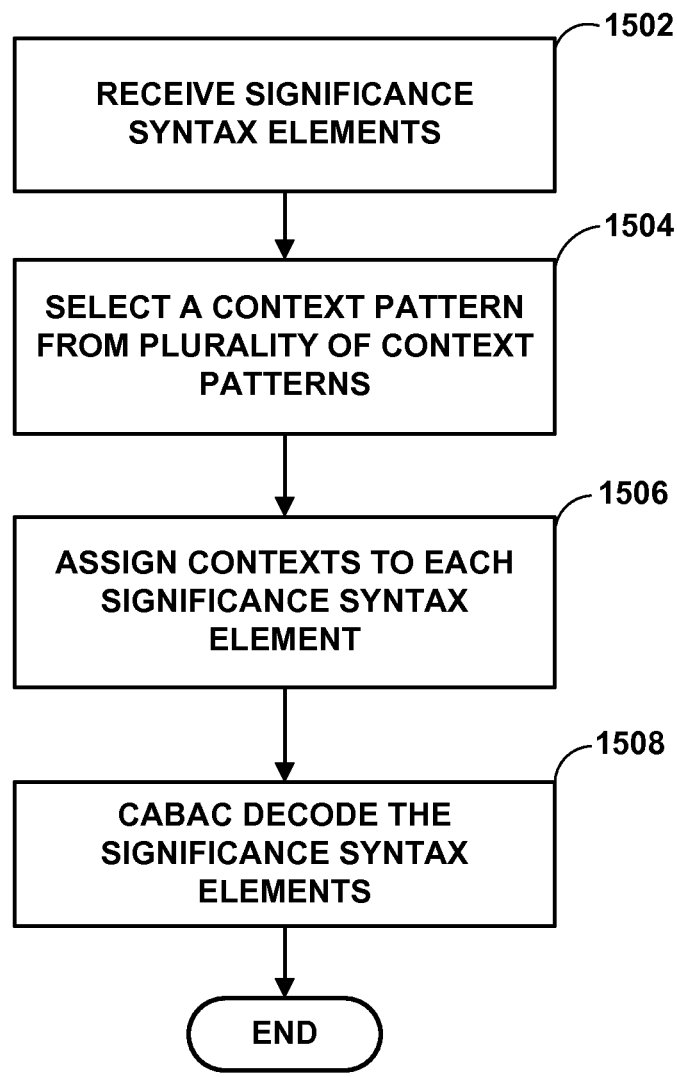
FIG. 15 is a flowchart illustrating decoding predictive syntax elements according to the techniques of this disclosure.

FIG. 15 is a flowchart illustrating an example of decoding video data according to the techniques of this disclosure. Although the process in FIG. 15 is described below as generally being performed by video decoder 30, the process may be performed by any combination of video decoder 30, entropy decoding unit 56, and/or context modeling unit 708.

As illustrated in FIG. 15, video decoder 30 receives, in an entropy encoded bitstream, significance syntax elements of transform coefficients for a current sub-block of a block (1502). The sub-block may be a 4×4 sub-block, and the block may be an 8×8 transform block. Similar to video encoder 20 (e.g., block 1104 of FIG. 11), video decoder 30 selects a context pattern from a same plurality of context patterns of two-dimensional context patterns for a plurality of scan types (e.g., a horizontal scan, a vertical scan, and a diagonal scan) for the significance syntax elements of the transform coefficients of the current sub-block (1504). In this example, each of the context patterns is associated with a condition of whether one or more neighboring blocks (e.g., a first neighboring sub-block and a second neighboring block) include any non-zero transform coefficients.

Video decoder 30, in a manner similar to that described above with respect to video encoder 20 (e.g., block 1106 of FIG. 11), assigns contexts to each of the significance syntax elements of the transform coefficients based on the selected context pattern (1506). For example, if the context pattern associated with the condition that $CGF_B$ equals 0 and $CGF_R$ equals 1 is selected, then video decoder 30 assigns a context to a first row that is different than the contexts for the other rows. If the context pattern associated with the condition that $CGF_B$ equals 1 and $CGF_R$ equals 0 is selected, then video decoder 30 assigns a context to a first column that is different than the contexts for the other columns. If the context pattern associated with the condition that $CGF_B$ equals 1 and $CGF_R$ equals 1 is selected, then video decoder 30 assigns a same context to the significance syntax elements. Video decoder 30 CABAC decodes the significance syntax elements based on the assigned contexts (1508).

Figure 16:
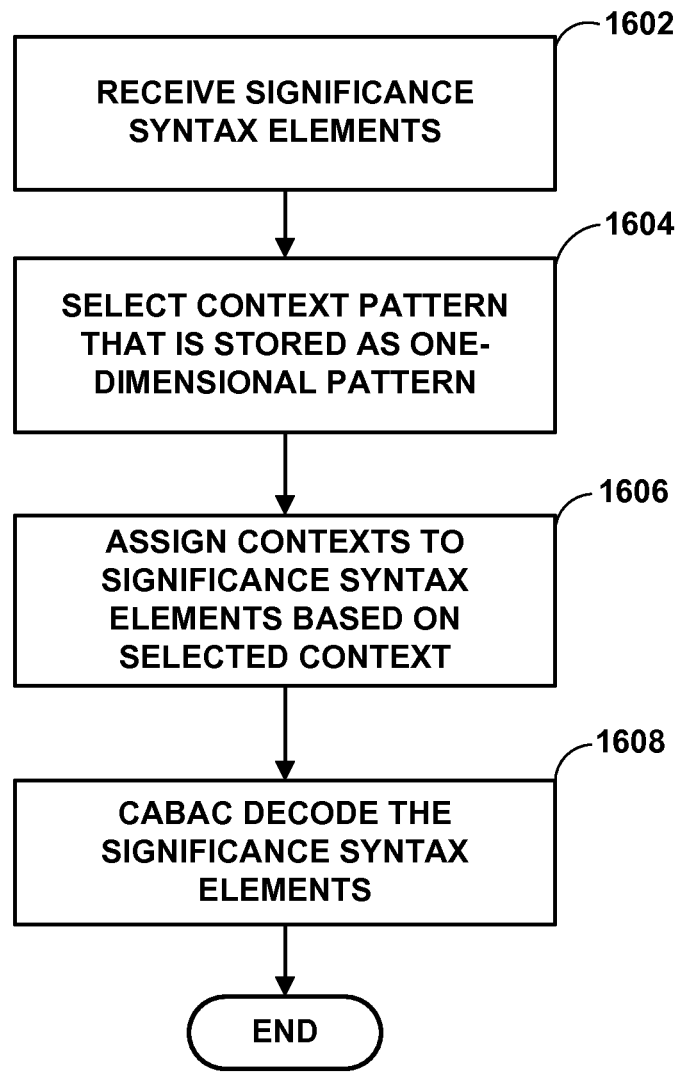
FIG. 16 is a flowchart illustrating decoding predictive syntax elements according to the techniques of this disclosure.

FIG. 16 is a flowchart illustrating an example of decoding video data according to the techniques of this disclosure. Although the process in FIG. 16 is described below as generally being performed by video decoder 30, the process may be performed by any combination of video decoder 30, entropy decoding unit 70, and/or context modeling unit 708.

As illustrated in FIG. 16, video decoder 30 receives, in an entropy encoded bitstream, significance syntax elements of transform coefficients for a current sub-block of a block (1602). The sub-block may be a 4×4 sub-block, and the block may be an 8×8 transform block. Similar to video encoder 20 (e.g., block 1204 of FIG. 12), video decoder 30 selects a context pattern that is stored as a one-dimensional context pattern (1604). The context pattern may be for two or more scan types (e.g., the horizontal, diagonal, and vertical scan types).

As one example, as described above, the selected context pattern defines a first context for a first significance syntax element in a scan order, defines a second context for a second and a third significance syntax element in the scan order, and defines a third context for remaining significance syntax elements in the scan order. As another example, as described above, the selected context pattern defines a first context for a first significance syntax element in a scan order, and defines a second context for remaining significance syntax elements in the scan order. As another example, the selected context pattern defines a same context for all of the significance syntax elements.

In some examples, the selected context pattern is selected from a plurality of context patterns that are stored as one-dimensional context patterns. For example, the plurality of context patterns are pre-computed and stored from the two-dimensional context patterns illustrated in FIGS. 9A-9D. As one example, one of the plurality of contexts patterns is pre-computed from a two-dimensional context pattern that includes contexts that if scanned horizontally or vertically results in a same one-dimensional context pattern. One example of such a two-dimensional context pattern is the context pattern illustrated in FIG. 9A. As another example, one of the plurality of contexts patterns is pre-computed from a two-dimensional context pattern that includes contexts that if scanned horizontally, vertically, or diagonally all result in the same one-dimensional context pattern. One example of such a two-dimensional context patter is the context pattern illustrated in FIG. 9D.

As another example, one of the plurality of context patterns is pre-computed from a first two-dimensional context pattern that includes contexts that if scanned horizontally result in a same one-dimensional context pattern as when a second two-dimensional context pattern is scanned vertically. One example of the first two-dimensional context pattern is the context pattern illustrated in FIG. 9B. One example of the second two-dimensional context patter is the context pattern illustrated in FIG. 9C.

Video decoder 30 assigns contexts to significance syntax elements based on the selected context (1606). Video decoder 20 CABAC decodes the significance syntax elements based on the assigned contexts (1608).

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method for decoding video data, the method comprising:
   receiving, in a bitstream, significance syntax elements of transform coefficients for a current sub-block of a block;
   selecting a context pattern from a plurality of context patterns, wherein the context pattern identifies contexts for two or more scan types of the current sub-block, wherein the plurality of context patterns are stored as respective one-dimensional context patterns and generated from a plurality of two-dimensional context patterns, wherein each one-dimensional context pattern includes context values from a horizontal, vertical, or diagonal scan of the two-dimensional context patterns, wherein a first context pattern of the plurality of context patterns comprises context values that are the same as context values of a first two-dimensional context pattern scanned horizontally and a second two-dimensional context pattern scanned vertically, and wherein only the first context pattern is stored to represent both a horizontal scan of the first two-dimensional context pattern and a vertical scan of the second two-dimensional context pattern;

assigning contexts to the significance syntax elements of the transform coefficients for the current sub-block based on the selected context pattern; and context adaptive binary arithmetic coding (CABAC) decoding the significance syntax elements of the transform coefficients of the current sub-block based on the assigned contexts.

2. The method of claim 1, wherein selecting the context pattern comprises selecting the context pattern for a scan type of a horizontal scan and a vertical scan.

3. The method of claim 1, wherein selecting the context pattern comprises selecting the context pattern that defines a first context for a first significance syntax element in a scan order, defines a second context for a second and a third significance syntax element in the scan order, and defines a third context for remaining significance syntax elements in the scan order.

4. The method of claim 1, wherein selecting the context pattern comprises selecting the context pattern that defines a first context for a first significance syntax element in a scan order, and defines a second context for remaining significance syntax elements in the scan order.

5. The method of claim 1, wherein selecting the context pattern comprises selecting the context pattern that defines a same context for all of the significance syntax elements.

6. The method of claim 1, wherein the current sub-block comprises a 4×4 sub-block, and the block comprises an 8×8 block.

7. The method of claim 1, wherein a second context pattern of the plurality of context patterns comprises contexts of a third two-dimensional context pattern that if scanned horizontally or vertically results in a same one-dimensional context pattern, wherein only the second context pattern is stored to represent both a horizontal scan of the third two-dimensional context pattern and a vertical scan of the third two-dimensional context pattern.

8. The method of claim 1, wherein a second context pattern of the plurality of context patterns comprises contexts of a third two-dimensional context pattern that if scanned diagonally, horizontally, and vertically results in a same one-dimensional context pattern, and wherein only the second context pattern is stored to represent a horizontal scan of the third two-dimensional context pattern, a vertical scan of the third two-dimensional context pattern, and a diagonal scan of the third two-dimensional context pattern.

9. A device for decoding video data, the device comprising:
a memory unit configured to store a plurality of context patterns; and
a video decoder configured to:
receive, in a bitstream, significance syntax elements of transform coefficients for a current sub-block of a block;
select a context pattern from the plurality of context patterns, wherein the context pattern identifies contexts for two or more scan types of the current sub-block, wherein the plurality of context patterns are stored as respective one-dimensional context patterns and generated from a plurality of two-dimensional context patterns, wherein each one-dimensional context pattern includes context values from a horizontal, vertical, or diagonal scan of the two-dimensional context patterns, wherein a first context pattern of the plurality of context patterns comprises context values that are the same as context values of a first two-dimensional context pattern scanned horizontally and a second two-dimensional context pattern scanned vertically, and wherein only the first context pattern is stored to represent both a horizontal scan of the first two-dimensional context pattern and a vertical scan of the second two-dimensional context pattern;

assign contexts to the significance syntax elements of the transform coefficients for the current sub-block based on the selected context pattern; and context adaptive binary arithmetic coding (CABAC) decode the significance syntax elements of the transform coefficients of the current sub-block based on the assigned contexts.

10. The device of claim 9, wherein, to select the context pattern, the video decoder is configured to select the context pattern for a scan type of a horizontal scan and a vertical scan.

11. The device of claim 9, wherein, to select the context pattern, the video decoder is configured to select the context pattern that defines a first context for a first significance syntax element in a scan order, defines a second context for a second and a third significance syntax element in the scan order, and defines a third context for remaining significance syntax elements in the scan order.

12. The device of claim 9, wherein, to select the context pattern, the video decoder is configured to select the context pattern that defines a first context for a first significance syntax element in a scan order, and defines a second context for remaining significance syntax elements in the scan order.

13. The device of claim 9, wherein, to select the context pattern, the video decoder is configured to select the context pattern that defines a same context for all of the significance syntax elements.

14. The device of claim 9, wherein the current sub-block comprises a 4×4 sub-block, and the block comprises an 8×8 block.

15. The device of claim 9, wherein a second context pattern of the plurality of context patterns comprises contexts of a third two-dimensional context pattern that if scanned horizontally or vertically results in a same one-dimensional context pattern, and wherein only the second context pattern is stored to represent both a horizontal scan of the third two-dimensional context pattern and a vertical scan of the third two-dimensional context pattern.

16. The device of claim 9, wherein a second context pattern of the plurality of context patterns is comprises contexts of a third two-dimensional context pattern that if scanned diagonally, horizontally, and vertically results in a same one-dimensional context pattern, and wherein only the second context pattern is stored to represent a horizontal scan of the third two-dimensional context pattern, a vertical scan of the third two-dimensional context pattern, and a diagonal scan of the third two-dimensional context pattern.

17. The device of claim 9, wherein the device comprises one of:
an integrated circuit;
a microprocessor; or
a wireless communication device that includes the video decoder.

18. A non-transitory computer-readable storage medium having instructions stored thereon that when executed cause one or more processors of a device for decoding video data to:
receive, in a bitstream, significance syntax elements of transform coefficients for a current sub-block of a block;
select a context pattern from a plurality of context patterns, wherein the context pattern identifies contexts for two or more scan types of the current sub-block, wherein the plurality of context patterns are stored as respective one-dimensional context patterns and generated from a plurality of two-dimensional context patterns, wherein each one-dimensional context pattern includes context values from a horizontal, vertical, or diagonal scan of the two-dimensional context patterns, wherein a first context pattern of the plurality of context patterns comprises context values that are the same as context values of a first two-dimensional context pattern scanned horizontally and a second two-dimensional context pattern scanned vertically, and wherein only the first context pattern is stored to represent both a horizontal scan of the first two-dimensional context pattern and a vertical scan of the second two-dimensional context pattern;
assign contexts to the significance syntax elements of the transform coefficients for the current sub-block based on the selected context pattern; and
context adaptive binary arithmetic coding (CABAC) decode the significance syntax elements of the transform coefficients of the current sub-block based on the assigned contexts.

19. The non-transitory computer-readable storage medium of claim 18, wherein the instructions that cause the one or more processors to select the context pattern comprise instructions that cause the one or more processors to select the context pattern that defines a first context for a first significance syntax element in a scan order, defines a second context for a second and a third significance syntax element in the scan order, and defines a third context for remaining significance syntax elements in the scan order.

20. The non-transitory computer-readable storage medium of claim 18, wherein the instructions that cause the one or more processors to select the context pattern comprise instructions that cause the one or more processors to select the context pattern that defines a first context for a first significance syntax element in a scan order, and defines a second context for remaining significance syntax elements in the scan order.

21. The non-transitory computer-readable storage medium of claim 18, wherein the instructions that cause the one or more processors to select the context pattern comprise instructions that cause the one or more processors to select the context pattern that defines a same context for all of the significance syntax elements.

22. A method for encoding video data, the method comprising:
generating significance syntax elements of transform coefficients for a current sub-block of a block;
selecting a context pattern from a plurality of context patterns, wherein the context pattern identifies contexts for two or more scan types of the current sub-block, wherein the plurality of context patterns are stored as respective one-dimensional context patterns and generated from a plurality of two-dimensional context patterns, wherein each one-dimensional context pattern includes context values from a horizontal, vertical, or diagonal scan of the two-dimensional context patterns, wherein a first context pattern of the plurality of context patterns comprises context values that are the same as context values of a first two-dimensional context pattern scanned horizontally and a second two-dimensional context pattern scanned vertically, and wherein only the first context pattern is stored to represent both a horizontal scan of the first two-dimensional context pattern and a vertical scan of the second two-dimensional context pattern;
assigning contexts to the significance syntax elements of the transform coefficients for the current sub-block based on the selected context pattern;
context adaptive binary arithmetic coding (CABAC) encoding the significance syntax elements of the transform coefficients of the current sub-block based on the assigned contexts; and
outputting the encoded significance syntax elements.

23. The method of claim 22, wherein selecting the context pattern comprises selecting the context pattern for a scan type of a horizontal scan and a vertical scan.

24. The method of claim 22, wherein selecting the context pattern comprises selecting the context pattern that defines a first context for a first significance syntax element in a scan order, defines a second context for a second and a third significance syntax element in the scan order, and defines a third context for remaining significance syntax elements in the scan order.

25. The method of claim 22, wherein selecting the context pattern comprises selecting the context pattern that defines a first context for a first significance syntax element in a scan order, and defines a second context for remaining significance syntax elements in the scan order.

26. The method of claim 22, wherein selecting the context pattern comprises selecting the context pattern that defines a same context for all of the significance syntax elements.

27. The method of claim 22, wherein the current sub-block comprises a 4×4 sub-block, and the block comprises an 8×8 block.

28. The method of claim 22, wherein a second context pattern of the plurality of context patterns comprises contexts of a third two-dimensional context pattern that if scanned horizontally or vertically results in a same one-dimensional context pattern, and wherein only the second context pattern is stored to represent both a horizontal scan of the third two-dimensional context pattern and a vertical scan of the third two-dimensional context pattern.

29. The method of claim 22, wherein a second context pattern of the plurality of context patterns comprises contexts of a third two-dimensional context pattern that if scanned diagonally, horizontally, and vertically results in a same one-dimensional context pattern, and wherein only the second context pattern is stored to represent a horizontal scan of the third two-dimensional context pattern, a vertical scan of the third two-dimensional context pattern, and a diagonal scan of the third two-dimensional context pattern.

30. A device for encoding video data, the device comprising:
a memory unit configured to store a plurality of context patterns; and
a video encoder configured to:
generate significance syntax elements of transform coefficients for a current sub-block of a block;
select the context pattern from the plurality of context patterns, wherein the context pattern identifies contexts for two or more scan types of the current sub-block, wherein the plurality of context patterns are stored as respective one-dimensional context patterns and generated from a plurality of two-dimensional context patterns, wherein each one-dimensional context pattern includes context values from a horizontal, vertical, or diagonal scan of the two-dimensional context patterns, wherein a first context pattern of the plurality of context patterns comprises context values that are the same as context values of a first two-dimensional context pattern scanned horizontally and a second two-dimensional context pattern scanned vertically, and wherein only the first context pattern is stored to represent both a horizontal scan of the first two-dimensional context pattern and a vertical scan of the second two-dimensional context pattern;

assign contexts to the significance syntax elements of the transform coefficients for the current sub-block based on the selected context pattern;

context adaptive binary arithmetic coding (CABAC) encode the significance syntax elements of the transform coefficients of the current sub-block based on the assigned contexts; and output the encoded significance syntax elements.

31. The device of claim 30, wherein, to select the context pattern, the video encoder is configured to select the context pattern for a scan type of a horizontal scan and a vertical scan.

32. The device of claim 30, wherein, to select the context pattern, the video encoder is configured to select the context pattern that defines a first context for a first significance syntax element in a scan order, defines a second context for a second and a third significance syntax element in the scan order, and defines a third context for remaining significance syntax elements in the scan order.

33. The device of claim 30, wherein, to select the context pattern, the video encoder is configured to select the context pattern that defines a first context for a first significance syntax element in a scan order, and defines a second context for remaining significance syntax elements in the scan order.

34. The device of claim 30, wherein, to select the context pattern, the video encoder is configured to select the context pattern that defines a same context for all of the significance syntax elements.

35. The device of claim 30, wherein the current sub-block comprises a 4×4 sub-block, and the block comprises an 8×8 block.

36. The device of claim 30, wherein a second context pattern of the plurality of context patterns comprises contexts of a third two-dimensional context pattern that if scanned horizontally or vertically results in a same one-dimensional context pattern, and wherein only the second context pattern is stored to represent both a horizontal scan of the third two-dimensional context pattern and a vertical scan of the third two-dimensional context pattern.

37. The device of claim 30, wherein a second context pattern of the plurality of context patterns comprises contexts of a third two-dimensional context pattern that if scanned diagonally, horizontally, and vertically results in a same one-dimensional context pattern, and wherein only the second context pattern is stored to represent a horizontal scan of the third two-dimensional context pattern, a vertical scan of the third two-dimensional context pattern, and a diagonal scan of the third two-dimensional context pattern.

38. A device for encoding video data, the device comprising:

means for generating significance syntax elements of transform coefficients for a current sub-block of a block;

means for selecting a context pattern from a plurality of context patterns, wherein the context pattern identifies contexts for two or more scan types of the current sub-block, wherein the plurality of context patterns are stored as respective one-dimensional context patterns and generated from a plurality of two-dimensional context patterns, wherein each one-dimensional context pattern includes context values from a horizontal, vertical, or diagonal scan of the two-dimensional context patterns, wherein a first context pattern of the plurality of context patterns comprises context values that are the same as context values of a first two-dimensional context pattern scanned horizontally and a second two-dimensional context pattern scanned vertically, and wherein only the first context pattern is stored to represent both a horizontal scan of the first two-dimensional context pattern and a vertical scan of the second two-dimensional context pattern;

means for assigning contexts to the significance syntax elements of the transform coefficients for the current sub-block based on the selected context pattern;

means for context adaptive binary arithmetic coding (CABAC) encoding the significance syntax elements of the transform coefficients of the current sub-block based on the assigned contexts; and means for outputting the encoded significance syntax elements.

39. The device of claim 38, wherein the means for selecting the context pattern comprises means for selecting the context pattern that defines a first context for a first significance syntax element in a scan order, defines a second context for a second and a third significance syntax element in the scan order, and defines a third context for remaining significance syntax elements in the scan order.

40. The device of claim 38, wherein the means for selecting the context pattern comprises means for selecting the context pattern that defines a first context for a first significance syntax element in a scan order, and defines a second context for remaining significance syntax elements in the scan order.

41. The device of claim 38, wherein the means for selecting the context pattern comprises means for selecting the context pattern that defines a same context for all of the significance syntax elements.

* * * * *